(12) United States Patent
Kumar et al.

(10) Patent No.: US 9,224,904 B1
(45) Date of Patent: Dec. 29, 2015

(54) COMPOSITE SUBSTRATES OF SILICON AND CERAMIC

(76) Inventors: Ananda Kumar, Fremont, CA (US); Tue Nguyen, Fremont, CA (US)

( * ) Notice: Subject to any disclaimer, the term of this patent is extended or adjusted under 35 U.S.C. 154(b) by 387 days.

(21) Appl. No.: 13/557,209

(22) Filed: Jul. 25, 2012

Related U.S. Application Data

(60) Provisional application No. 61/511,103, filed on Jul. 24, 2011, provisional application No. 61/542,292, filed on Oct. 3, 2011, provisional application No. 61/542,294, filed on Oct. 3, 2011, provisional application No. 61/542,295, filed on Oct. 3, 2011, provisional application No. 61/591,874, filed on Jan. 28, 2012, provisional application No. 61/591,875, filed on Jan. 28, 2012, provisional application No. 61/624,376, filed on Apr. 15, 2012.

(51) Int. Cl.
*H01L 31/18* (2006.01)
*H01L 21/762* (2006.01)
*H01L 31/0224* (2006.01)

(52) U.S. Cl.
CPC ....... *H01L 31/1804* (2013.01); *H01L 21/76254* (2013.01); *H01L 31/022425* (2013.01)

(58) Field of Classification Search
CPC .............. H01L 21/187; H01L 21/6836; H01L 2221/68368; H01L 2221/68381; H01L 23/4827; H01L 24/96; H01L 2924/09701; H01L 2924/10329; H01L 2924/10336; H01L 21/02175; H01L 27/1203

USPC ............... 257/E23.017, E21.01, E21.021, 257/E21.274, E21.211, E27.112, 296; 438/459, 573

See application file for complete search history.

(56) References Cited

U.S. PATENT DOCUMENTS

| | | | | |
|---|---|---|---|---|
| 7,358,152 B2 * | 4/2008 | Kub et al. | | 438/459 |
| 7,390,725 B2 * | 6/2008 | Maa et al. | | 438/458 |
| 7,535,100 B2 * | 5/2009 | Kub et al. | | 257/728 |
| 2003/0064535 A1 * | 4/2003 | Kub et al. | | 438/22 |
| 2004/0077166 A1 * | 4/2004 | Nagal et al. | | 438/689 |
| 2006/0234486 A1 * | 10/2006 | Speck et al. | | 438/590 |
| 2007/0164417 A1 * | 7/2007 | Todd et al. | | 257/685 |
| 2008/0296617 A1 * | 12/2008 | Mishra et al. | | 257/190 |
| 2009/0081848 A1 * | 3/2009 | Erokhin et al. | | 438/455 |
| 2009/0194162 A1 * | 8/2009 | Sivaram et al. | | 136/258 |
| 2010/0044827 A1 * | 2/2010 | Lee et al. | | 257/506 |
| 2010/0139755 A1 * | 6/2010 | Petti et al. | | 136/256 |
| 2010/0178723 A1 * | 7/2010 | Henley | | 438/71 |
| 2010/0330731 A1 * | 12/2010 | Agarwal et al. | | 438/73 |
| 2011/0117726 A1 * | 5/2011 | Pinnington et al. | | 438/458 |
| 2011/0262115 A1 * | 10/2011 | Yokouchi | | 392/407 |
| 2013/0069191 A1 * | 3/2013 | Or-Bach et al. | | 257/432 |

\* cited by examiner

*Primary Examiner* — Stephen W Smoot
*Assistant Examiner* — Edward Chin

(57) ABSTRACT

Composite substrates include a silicon layer disposed on a ceramic layer. Different thermal expansion coefficient for the composite substrates can be achieved by changing the thermal expansion coefficient of the ceramic layer. Composite substrates can include two layers of silicon sandwiching a layer of ceramic.

10 Claims, 22 Drawing Sheets

---

Selecting a substrate having a silicon layer
25

↓

Depositing a GaN layer on the substrate with thickness less than 1/30 times the thickness of the silicon layer
26

COMPOSITE SUBSTRATES OF SILICON AND CERAMIC

This application claims priority from U.S. provisional patent application Ser. No. 61/511,103, filed on Jul. 24, 2011, entitled "Enabling Growing Crack-free Gallium Nitride Layers on Silicon Wafers", This application claims from U.S. provisional patent application Ser. No. 61/542,292, filed on Oct. 3, 2011, entitled "Silicon Ceramic Composite Substrates for Gallium Nitride Deposition"

This application claims from U.S. provisional patent application Ser. No. 61/542,294, filed on Oct. 3, 2011, entitled "Method for Releasing GaN device layer from the growth substrate"

This application claims from U.S. provisional patent application Ser. No. 61/542,295, filed on Oct. 3, 2011, entitled "Method for stress-compensated support layer for thin silicon or sapphire substrates used for growth of gallium nitride"

This application claims from U.S. provisional patent application Ser. No. 61/591,874, filed on Jan. 28, 2012, entitled "Compression layer on GaN"

This application claims from U.S. provisional patent application Ser. No. 61/591,875, filed on Jan. 28, 2012, entitled "Preparing silicon wafers for gallium nitride deposition, and structures resulting therefrom."

This application claims from U.S. provisional patent application Ser. No. 61/624,376, filed on Apr. 15, 2012, entitled "Structures and Methods for Silicon-Ceramic Composite Wafers for Gallium Nitride Growth"

which are incorporated herein by reference.

BACKGROUND

World-wide, dates have been set for phase out incandescent bulbs beginning in 2-5 years. White LEDs are the best candidates to fill the need for energy efficient, and it is also hoped cost-effective replacement for the light bulb, with projected costs decreasing from today's over $2 mark to about $0.75 in 2012. A tenfold decrease in the cost of LEDs is required for their wide acceptance for general lighting applications. While the GaN deposition processes and device technology have matured satisfactorily, the low productivity and high costs associated with sapphire substrates used for their deposition are recognized to be a major roadblock to such cost reduction. Replacing silicon wafers for sapphire will solve both these problems. This invention is aimed at solving the hitherto intractable problem of gallium nitride films cracking when grown on silicon.

Today, GaN for LEDs is epitaxially deposited on sapphire (single crystal aluminum oxide), or on single crystal silicon carbide substrates. Production of these substrates is highly specialized, and it is difficult obtain substrates larger than 4" in diameter, and more than 50% of GaN is grown on 2" sapphire substrates, and 95% on sapphire substrates range from 2-4" in diameter. The high cost of the substrates, and low productivity entailed in using small substrates, make GaN LEDs expensive.

In contrast to sapphire and silicon carbide, single crystal silicon wafer are produced in large quantities, relatively inexpensively, and in sizes up to 8-12" diameter. Using silicon for GaN deposition would greatly reduce the cost of GaN by decreasing the cost of the substrates and, much more significantly, by increasing productivity, in epitaxy and in subsequent processes involved in LED production.

Ability to grow gallium nitride on silicon is a highly sought after objective in the GaN industry. However, two very important technical hurdles have to be overcome to make this a reality. The first of these is of a fundamental nature, viz. that the large lattice mismatch between silicon and GaN will not allow epitaxial growth, ie. growth of single crystal GaN on single crystal silicon. This challenge also existed for growth on sapphire, and to a lesser extent silicon carbide, where buffer layers of other crystalline materials (Aluminum Nitride, Gallium Aluminum Nitride, etc) are deposited on the substrate to bridge the lattice mismatch. The same approach has been developed for growing GaN epitaxially single crystal silicon substrates. In fact, this has enabled limited commercial production of GaN devices on silicon.

The second hurdle involves the mismatch in the coefficients of thermal expansions (CTEs) of GaN and silicon. The sign and magnitude of this mismatch between them are such that the GaN will be in tension when cooled from the growth temperature of about 1000 C. This tensile stress leads to extensive cracking of the GaN along its easy cleavage planes. A practical effect of this cracking is to limit the thickness and device sizes that can be fabricated. Sapphire is the preferred substrate for GaN thoughtout the industry, because its CTE is higher than that of GaN and thereby induces compressive stress in the GaN epitaxial layer when cooled to room temperature. Silicon, on the other hand, puts the GaN in tension as it is cooled to room temperature, and therefore tends to crack for GaN films thicker than few microns.

The coefficients of thermal expansion, CTE, of pure crystalline materials are inherent material properties, and cannot be changed. This problem has therefore not, far lent itself to easy solution so far. Limited relief has been obtained by inserting so-called 'stress relief' layers, also deposited epitaxially, on the silicon surface. These surface layers, usually only a few atomic layers thick, require very careful control of the deposition conditions, including by ultra-careful stress monitoring during deposition. In conjunction with such stress control layers, the deposits is either pre-scored, or masked-off with in-situ silicon nitride masking, to limit the lateral dimensions of devices, so that the cracking will not cut though the devices, but led along their boundaries.

In the face of these difficulties, sapphire, as expensive as it is, continues to be the dominant substrate used for GaN LED deposition. It is therefore a need to enable the use of silicon wafers by finding more robust solution to the tensile cracking of gallium nitride.

DETAILED DESCRIPTION OF THE PREFERRED EMBODIMENTS

The coefficients of thermal expansion, CTE of gallium nitride and silicon differ by upwards of 55%, with the CTE of silicon being the lower of the two. This causes tensile stress in gallium nitride layer upon cooling from the high temperatures of epitaxial growth and leads to extensive cracking along crystallographic planes, in films thicker than about 1 μm.

It should be noted that silicon carbide, even with about 20% CTE mismatch on the same sign as silicon, gallium nitride grown on silicon carbide survive without cracking So minimizing the tensile load on the gallium nitride film grown on silicon will help it to survive cooling to room temperature without cracking.

In an embodiment, the invention recognizes that the tensile stress of the gallium nitride film is directly proportional to the thickness of the silicon substrate on which it is grown. Therefore, decreasing the silicon substrate thickness would lower the tendency towards cracking. The present description uses the term "silicon substrate" or "silicon layer" to denote silicon-containing substrate or layer, such as silicon-germanium or silicon carbide substrate or layer.

Thus in an embodiment, the present invention discloses a combination of thinner silicon substrate with thicker gallium nitride layer for lowering the cracking tendency in the gallium nitride layer. The present invention providing thicker gallium nitride layers further has additional advantages of improving device characteristics on gallium nitride layers.

In an embodiment, the invention describes convenient and economical methods for achieving non-cracking gallium nitride layer on silicon substrates, comprising determining a proper thickness for the silicon substrates with respect to a desired thickness of a gallium nitride film to be deposited thereon. Alternatively, the present invention determines a thickness of the gallium nitride film given a silicon substrate having a predetermined thickness. Alternatively, the present invention discloses balancing the two thicknesses to avoid cracking of the deposited gallium nitride.

Figure 1:
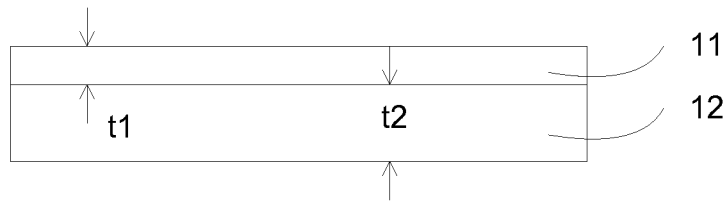
FIG. 1 illustrates an exemplary layer stack according to an embodiment of the present invention.

FIG. 1 illustrates an exemplary layer stack according to an embodiment of the present invention. A layer of GaN 11 having thickness $t_{GaN}$ is disposed on a layer of silicon 12 having thickness $t_{Si}$.

Since the expansion of gallium nitride is larger than that of silicon, upon cooling, the gallium nitride is under tension and the silicon is under compression, with the ratio established by equalizing the tension force of gallium nitride and the compression force of silicon. Assuming a harmonic relationship between the restoring force and the displacement of the atoms from the equilibrium positions, we would have $$t_{GaN}k_{GaN}x_{GaN}^2 = t_{Si}k_{Si}x_{Si}^2$$

Assuming similar coefficients for GaN and silicon, the ratio of the thickness would be inversely proportional to the square of the displacements $$\frac{t_{Si}}{t_{GaN}} = \frac{x_{GaN}^2}{x_{Si}^2}$$

From the data for GaN on silicon and GaN on silicon carbide, we observe that if GaN is tensile at 35% (55%-20%), and silicon is compressed at 20%, then the GaN does not crack. Thus, for a first order approximation, we have $$\frac{t_{Si}}{t_{GaN}} = \frac{0.35^2}{0.2^2} = 3$$

Or the silicon should be thinner than about 3 times the thickness of GaN. This is first order approximation, so one would expect the data to be of the same order of magnitude. To address other variations, the silicon substrate probably should not be thicker than about 30× the thickness of the deposited GaN.

In an embodiment, the present invention discloses methods and substrates for GaN deposition on silicon, comprising a GaN layer deposited on a silicon layer, wherein the thickness of the silicon is less than 30 times the thickness of the GaN. Preferably, the silicon thickness is less than 15 times, and more preferably, less than 5 times. The substrate for GaN deposition can be a silicon substrate comprising only a silicon layer. The substrate for GaN deposition can also be any substrate, comprising a silicon layer on other layers.

Figure 2A:
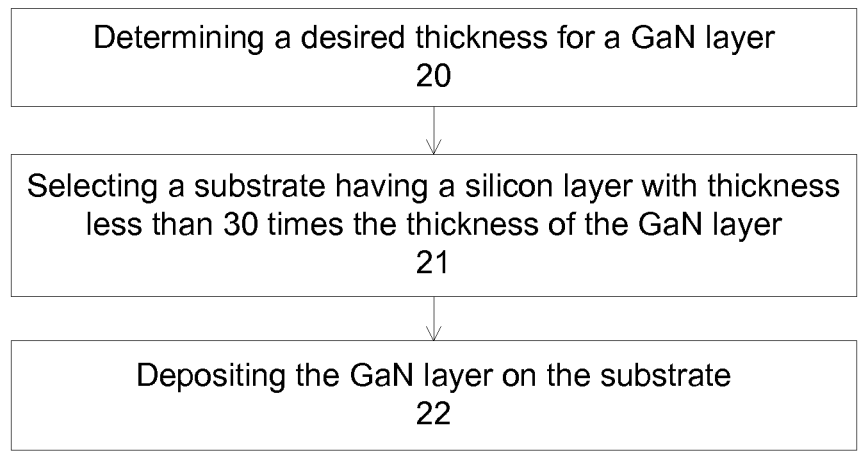
FIGS. 2A-2B illustrate exemplary methods to prepare GaN substrates according to an embodiment of the present invention.
Figure 2B:
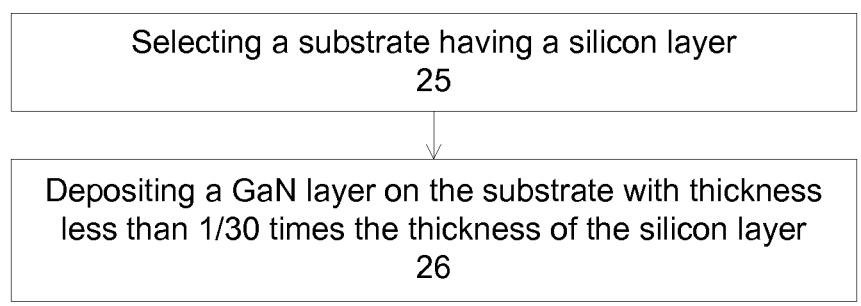

In an embodiment, the present invention discloses methods for preparing GaN substrates for LED fabrication. FIGS. 2A-2B illustrate exemplary methods to prepare GaN substrates according to an embodiment of the present invention. The methods can comprising first determining a desired thickness for the GaN layer, then selecting a substrate having a silicon layer with thickness according to the present invention, e.g. less than 30 times, preferably less than 15 times, and more preferably less than 5 times the thickness of the desired GaN layer. Afterward, the substrate is subjected to a GaN deposition process, depositing a GaN layer on the silicon substrate without cracking.

The methods can comprise first selecting a substrate having a silicon layer, then the substrate is subjected to a GaN deposition process, depositing a GaN layer on the silicon substrate without cracking. The thickness of the deposited GaN layer is according to the present invention, e.g. chosen so that the thickness of the silicon layer is less than 30 times, preferably less than 15 times, and more preferably less than 5 times the thickness of the desired GaN layer.

In an embodiment, a composite substrate can be formed with the silicon layer extracted from a thicker silicon substrate. For example, by annealing a composite substrate of a layer (such as GaN layer) having higher thermal expansion coefficient, which is adhered to a silicon substrate, the difference in thermal expansion can cause the silicon substrate to exfoliate, cracking along a crystal plane. Thus a thin silicon layer is extracted from the silicon substrate and still attached to the GaN layer. This exfoliation process is based on the difference in thermal expansion of the two adhering layers, causing stress in the silicon substrate enough to peel off a layer of silicon.

In an embodiment, the present invention discloses a process forming a thin silicon layer on a support substrate with improved controllability. For example, an exfoliation process can extract a silicon layer from a silicon substrate, but the thickness uniformity of the silicon layer can be hard to control. In an embodiment, the present invention discloses setting a defect plane or layer at a desired thickness of the silicon substrate before an exfoliation process, wherein the defect plane can act as nucleation sites for the exfoliation, causing a silicon layer to be released from the silicon substrate at the defect plane. The defect plane can be generated by ion implantation to form a plane of impurity at a region beneath the surface of the silicon substrate. The defect plane can be generated by wet etching, forming a plane of void bubbles at a region underneath the substrate surface. Alternatively, a partial defect layer can be generated on the surface of the silicon substrate, and a layer of silicon, preferably epitaxial silicon, can be deposited on the surface of the silicon substrate, using the undefect area as seed sites, to bury the defect plane underneath the surface.

In an embodiment, the present invention discloses depositing a GaN layer on a silicon substrate that has a defect plane generated underneath the surface. After being cooled to room temperature, the difference in thermal expansion causes the silicon substrate to exfoliate at the defect plane, creating a composite substrate comprising a silicon layer strongly bonded with a GaN layer. The silicon substrate surface can be any crystallographic plane, such as (100) or (110), and preferably (111).

A thin silicon layer can be defined from a nominally thick Si, such as a (111) wafer, by implantation of suitable gaseous ions such as hydrogen, helium, or oxygen, for example, by methods commonly known in the industry. After the ion implantation step, the wafer is used as is, for gallium nitride growth by MOCVD or MBE methods, using appropriate buffer layers for lattice bridging known in the art. The gallium nitride layers are gown to thicknesses of 5 to 50 µm. As the wafer is being cooled to room temperature, the stress build up, leads to 'exfoliation' of the gallium nitride—thin silicon composite wafer, greatly relieving the CTE-mismatch stress, by decoupling it from the thicker silicon wafer, as well as, allowing the thin composite wafer to deform rather than crack.

Figure 3A:
FIGS. 3A-3D illustrate an exemplary process to form a GaN layer on a silicon layer using an exfoliate process according to an embodiment of the present invention.
Figure 3B:
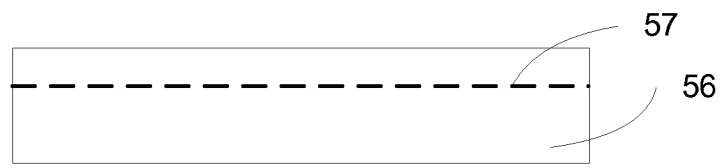
Figure 3C:
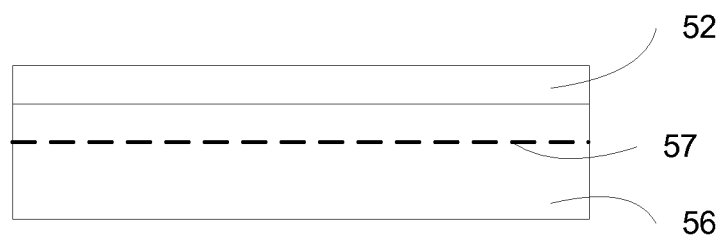
Figure 3D:
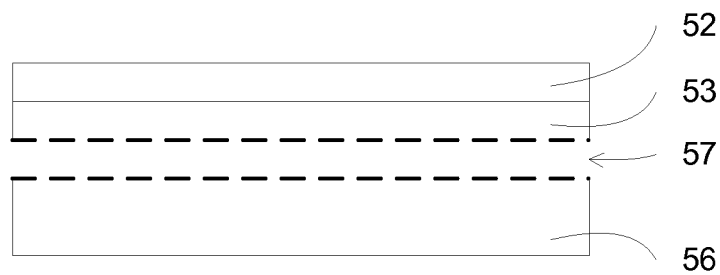

FIGS. 3A-3D illustrate an exemplary process to form a GaN layer on a silicon layer using an exfoliate process according to an embodiment of the present invention. In FIG. 3A, a silicon substrate 56, preferably having (111) orientation surface, is provided. An impurity implantation process, such as hydrogen, helium or oxygen implantation, is performed on the surface of the silicon wafer 56, creating an impurity region 57 underneath the silicon surface (FIG. 3B). The silicon substrate 56 with the implantation layer 57 is then subjected to a GaN deposition process, depositing a layer of GaN 52 on the silicon surface (FIG. 3C). The GaN deposition is typically performed at high temperature, for example, above 800 C. After removing the silicon substrate having the deposited GaN from the deposition chamber, the substrate is cooled to room temperature, and the thermal expansion mismatch can exfoliate the silicon substrate at the defect plane of impurity implantation 57, creating a composite substrate comprising a GaN on a silicon layer, and a remaining silicon substrate (FIG. 3D). In an embodiment, a rapid cooling process can be used, for example, to accelerate the exfoliation process.

In an embodiment, to prevent cracking of the GaN layer, the thicknesses of the two layers in the composite substrate is selected according to the above description, for example, the silicon thickness is less than 30×, preferably less than 15×, or more preferably less than 5×, of the GaN layer thickness.

In an embodiment, the present invention discloses a composite substrate, and method to fabricate such as substrate, comprising a layer of GaN on a layer of silicon carbide. For example, the thin silicon layer, after defined by the ion implantation process, is converted, partially or fully, into single crystal 3C—SiC by a separate carburization step, prior to its use as growth substrates for gallium nitride. Here again, the CTE is stress is reduced and relieved by the stress-induced exfoliation from the thicker silicon substrate during cooling from growth temperature.

In an embodiment, the carburizing step of the thin silicon is carried out in-situ, prior to the gallium nitride growth step, in the same reactor, followed by gallium nitride growth. This will save one heating step, and also prevent any premature layer exfoliation that may occur on cooling from the carburizing step.

Figure 4A:
FIGS. 4A-4E illustrate an exemplary process to form a GaN layer on a silicon carbide layer using an exfoliate process according to an embodiment of the present invention.
Figure 4B:
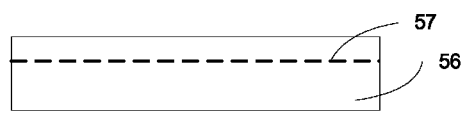
Figure 4C:
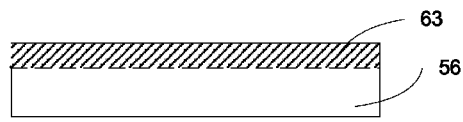
Figure 4D:
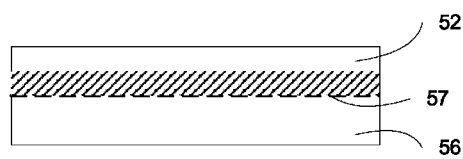
Figure 4E:
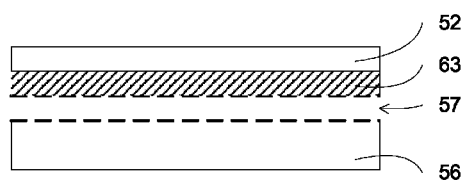

FIGS. 4A-4E illustrate an exemplary process to form a GaN layer on a silicon carbide layer using an exfoliate process according to an embodiment of the present invention. In FIG. 4A, a silicon substrate 56, preferably having (111) orientation surface, is provided. An impurity implantation process, such as hydrogen, helium or oxygen implantation, is performed on the surface of the silicon wafer 56, creating an impurity region 57 underneath the silicon surface (FIG. 4B). The silicon substrate 56 with the implantation layer 57 is then subjected to a process, such as a carburization process, converting the top portion of the silicon substrate above the implantation plane 57 to silicon carbide (FIG. 4C). More or less silicon thickness can also be used. Afterward, the silicon substrate 56 with the top portion converted to silicon carbide layer 63 is then subjected to a GaN deposition process, depositing a layer of GaN 52 on the silicon surface (FIG. 4D). After removing the silicon substrate having the deposited GaN from the deposition chamber, the substrate is cooled to room temperature, and the thermal expansion mismatch can exfoliate the silicon substrate at the defect plane of impurity implantation 57, creating a composite substrate comprising a GaN on a silicon carbide layer, and a remaining silicon substrate (FIG. 4E).

In an embodiment, to prevent cracking of the GaN layer, the thicknesses of the two layers in the composite substrate is selected according to the above description, for example, the silicon carbide thickness is less than 30×, preferably less than 15×, or more preferably less than 5×, of the GaN layer thickness.

In an embodiment, the present invention discloses a composite substrate comprising a GaN layer on a silicon layer, and methods to fabricate such a substrate using a porous silicon process. For example, a thin silicon layer is grown by epitaxial deposition from silicon-containing gasses such as silane, and tri-chloro-silane, TCS. The thin silicon layer, for example, 1-5 micron, is then etched, for example, by anodic etching in hydrofluoric acid, to form a porous silicon layer. The porous layer structure may contain a single layer of 20-50% porosity, or a two-layer pore structure of 10-30% top layer over a 40-60% porosity layer next to the silicon surface. The structures and processes for producing these pore structure are designed to facilitate the easy exfoliation of the epitaxially grown wafer film. An epitaxially grown single crystal silicon layer is then disposed on the porous silicon layer, and can be of any desired thickness, ranging from less than a micron to 50 µm. The pore structures undergo great changes at the high temperature silicon growth temperatures in the presence of hydrogen and silicon containing gas, with the low porosity layer completely bridging to from good single crystal silicon surface for epitaxially growth of silicon, while high porosity layer bridged coalesces to nearly completely porous regions with isolated silicon pillars tenuously attaching the epitaxial wafer to the growth wafer.

The thin silicon wafer film, weakly bonded to the thicker silicon growth substrate, is used for 5-50 µm thick gallium nitride layer. After the gallium nitride deposition, the thinness of the silicon growth wafer, coupled with stress relief from exfoliation from the thicker growth substrate at the line of the large pores, will produce the desired outcome, viz. a free-standing film of thick, crack-free gallium nitride layer on thin silicon (111). The latter can be used as such to fabricate gallium nitride devices, or it can be bonded to other substrates by low temperature bonding methods for further steps of device processing. The thin silicon also may be removed, if desired, by wet etching after such bonding.

Figure 5A:
FIGS. 5A-5F illustrate an exemplary process to form a GaN layer on a silicon layer using an exfoliate process on a porous silicon substrate according to an embodiment of the present invention.
Figure 5B:
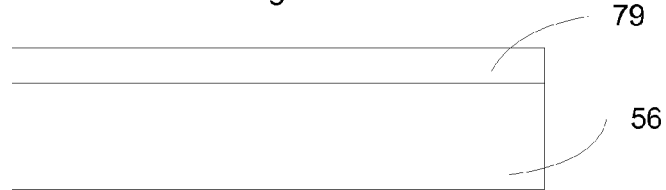
Figure 5C:
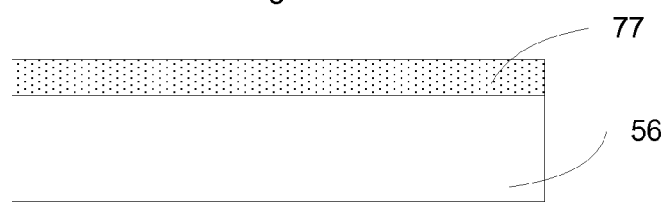
Figure 5D:
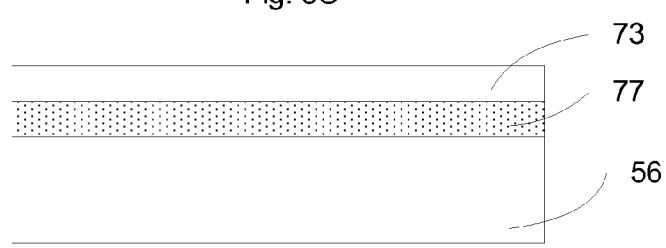
Figure 5E:
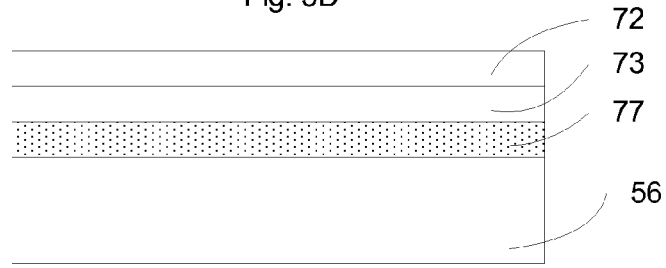
Figure 5F:
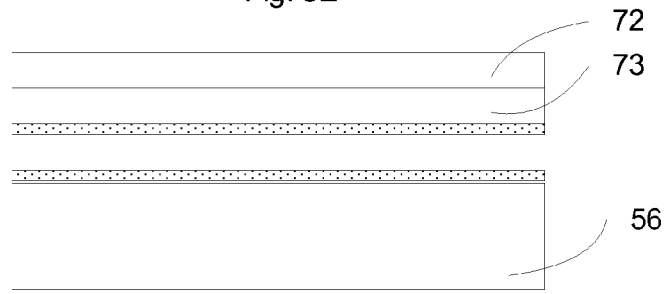

FIGS. 5A-5F illustrate an exemplary process to form a GaN layer on a silicon layer using an exfoliate process on a porous silicon substrate according to an embodiment of the present invention. In FIG. 5A, a silicon substrate 56, preferably having (111) orientation surface, is provided. A thin epitaxial silicon layer 79 is deposited on the silicon substrate 56, preferably having impurities to facilitate a subsequent wet etch process (FIG. 5B). An etch process, such as a wet etch process, and preferably an anodic etch process, is performed on the deposited silicon layer 79. Defects are preferentially etched, creating a porous silicon layer 77 (FIG. 5C). Small pores at the surface are preferred, to facilitate a subsequent epitaxial silicon deposition, with the remaining silicon on the surface serving as seed sites. Larger pores underneath the surface are preferred, to facilitate a subsequent exfoliation process. Multiple silicon layers 79 can be deposited with different defect densities, to create multiple layers having different pore densities. In FIG. 5D, a second epitaxial silicon layer 73 is deposited on the porous silicon layer 77. The silicon substrate is then subjected to a GaN deposition process, depositing a layer of GaN 72 on the silicon surface (FIG. 5E). After removing the silicon substrate having the deposited GaN from the deposition chamber, the substrate is cooled to room temperature, and the thermal expansion mismatch can exfoliate the silicon substrate at the defect region of porous silicon layer 77, creating a composite substrate comprising a GaN on a silicon layer, and a remaining silicon substrate (FIG. 5F). An optional cleaning process can be performed to clean the remaining porous silicon layer.

In an embodiment, to prevent cracking of the GaN layer, the thicknesses of the two layers in the composite substrate of GaN/silicon is selected according to the above description, for example, the silicon thickness is less than 30×, preferably less than 15×, or more preferably less than 5×, of the GaN layer thickness.

Figure 6A:
FIGS. 6A-6E illustrate another exemplary process to form a GaN layer on a silicon layer using an exfoliate process on a porous silicon substrate according to an embodiment of the present invention.
Figure 6B:
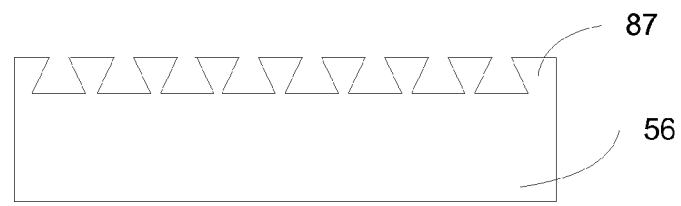
Figure 6C:
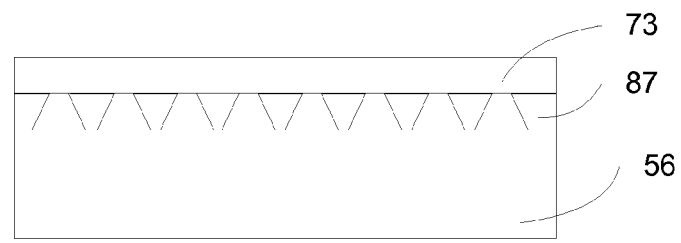
Figure 6D:
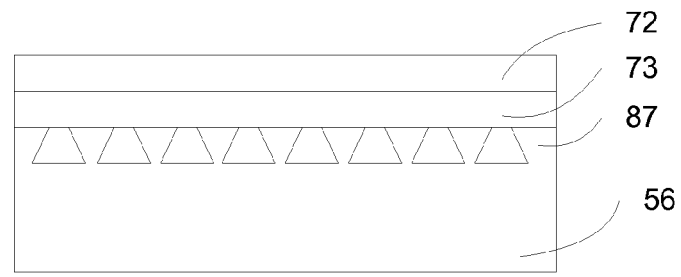
Figure 6E:
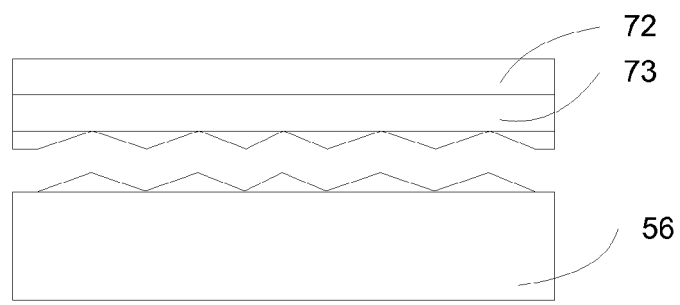

Other processes to form a porous silicon layer can be used, such as an impurity implantation and wet etch to remove impurities, or a patterning process. FIGS. 6A-6E illustrate another exemplary process to form a GaN layer on a silicon layer using an exfoliate process on a porous silicon substrate according to an embodiment of the present invention. In FIG. 6A, a silicon substrate 56, preferably having (111) orientation surface, is provided. A patterning process, such as a wet etch process utilizing a lithography mask, is performed on the surface of the silicon substrate 56. The etch pattern can be tapers, larger at the bottom and smaller at the top near the silicon surface, creating a patterned silicon layer 87 (FIG. 6B). Small openings at the surface are preferred, to facilitate a subsequent epitaxial silicon deposition, with the remaining silicon on the surface serving as seed sites. Larger openings underneath the surface are preferred, to facilitate a subsequent exfoliation process. In FIG. 6C, a second epitaxial silicon layer 73 is deposited on the patterned silicon layer 87. The silicon substrate is then subjected to a GaN deposition process, depositing a layer of GaN 72 on the silicon surface (FIG. 6D). After removing the silicon substrate having the deposited GaN from the deposition chamber, the substrate is cooled to room temperature, and the thermal expansion mismatch can exfoliate the silicon substrate at the defect region of patterned silicon layer 87, creating a composite substrate comprising a GaN on a silicon layer, and a remaining silicon substrate (FIG. 6E). An optional cleaning process can be performed to clean the remaining patterned silicon layer.

In an embodiment, an additional process step is included to convert the silicon layer (for example, layer 73) into a silicon carbide layer. The process is similar to the above description, combining the different features. The conversion process can be a carburized step, converting the silicon layer to 3C—SiC, before using the composite structure for gallium nitride growth. This carburization can be either partial or total conversion of thin silicon layer to 3C—SiC. In a variation of the above embodiments, the conversion of the thin silicon layer to 3C—SiC, partially or completely, can be carried out in the same heating step, but prior gallium nitride growth.

Figure 7A:
FIGS. 7A-7E illustrate an exemplary process to form a GaN layer on a silicon carbide layer using an exfoliate process on a porous silicon substrate according to an embodiment of the present invention.
Figure 7B:
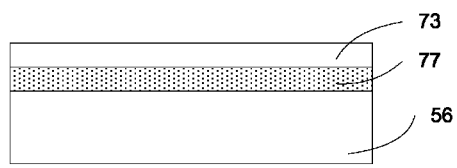
Figure 7C:
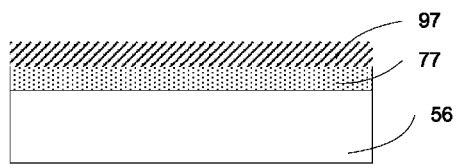
Figure 7D:
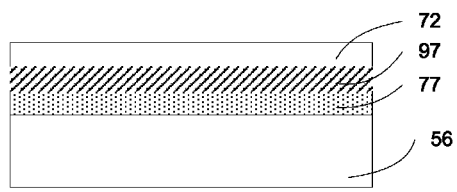
Figure 7E:
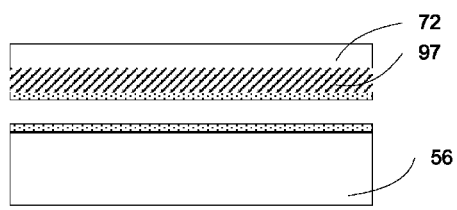

FIGS. 7A-7E illustrate an exemplary process to form a GaN layer on a silicon carbide layer using an exfoliate process on a porous silicon substrate according to an embodiment of the present invention. Similar process using patterned silicon layer can be used. In FIG. 7A, a silicon substrate 56, preferably having (111) orientation surface, is provided. A thin epitaxial silicon layer 77 is deposited on the silicon substrate 56, preferably having impurities to facilitate a subsequent wet etch process. An etch process, such as a wet etch process, and preferably an anodic etch process, is performed on the deposited silicon layer 79. Defects are preferentially etched, creating a porous silicon layer 77. A second epitaxial silicon layer 73 is deposited on the porous silicon layer 77 (FIG. 7B). The epitaxial silicon layer 73 is then converted to silicon carbide layer 97 (FIG. 7C). The silicon substrate is then subjected to a GaN deposition process, depositing a layer of GaN 72 on the silicon surface (FIG. 7D). After removing the silicon substrate having the deposited GaN from the deposition chamber, the substrate is cooled to room temperature, and the thermal expansion mismatch can exfoliate the silicon substrate at the defect region of porous silicon layer 77, creating a composite substrate comprising a GaN on a silicon layer, and a remaining silicon substrate (FIG. 7E).

In an embodiment, to prevent cracking of the GaN layer, the thicknesses of the two layers in the composite substrate of GaN/silicon carbide is selected according to the above description, for example, the silicon carbide thickness is less than 30×, preferably less than 15×, or more preferably less than 5×, of the GaN layer thickness.

Figure 8:
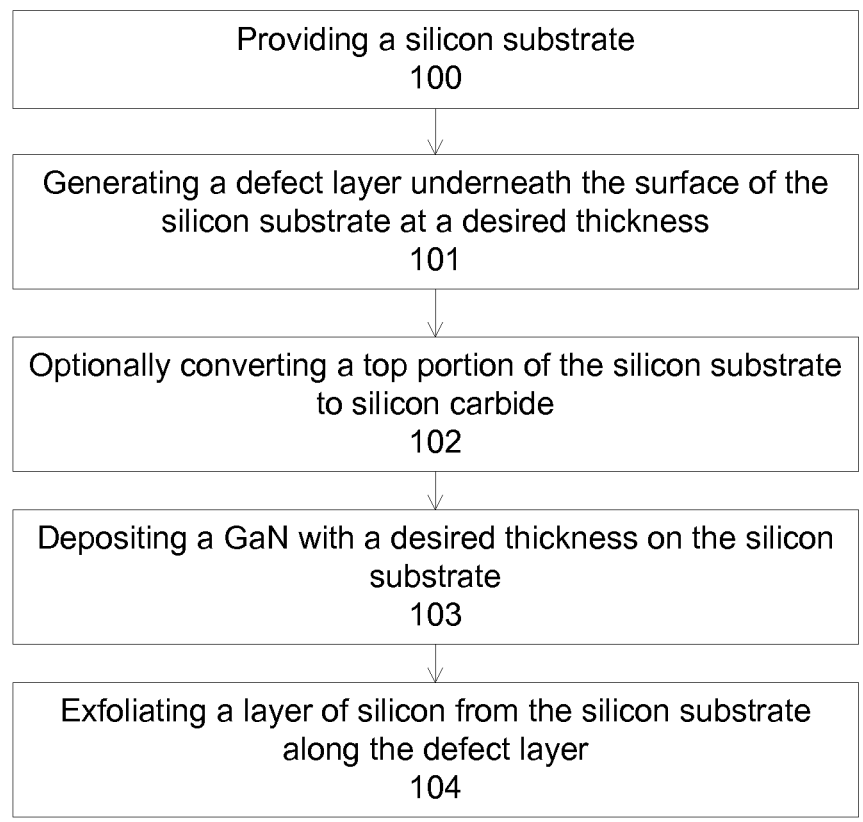
FIG. 8 illustrates an exemplary flowchart to form a composite substrate comprising a GaN layer on a silicon or silicon carbide layer according to an embodiment of the present invention.

FIG. 8 illustrates an exemplary flowchart to form a composite substrate comprising a GaN layer on a silicon or silicon carbide layer according to an embodiment of the present invention. Operation 100 provides a silicon substrate. Operation 101 generates a defect layer underneath the silicon substrate surface at a desired depth, for example, by ion implantation. The depth is designed to ensure that the subsequently deposited GaN is not crack under tensile stress. Operation 102 optionally converts a top portion of the silicon substrate to silicon carbide. Operation 103 deposits a GaN with a desired thickness on the silicon substrate. Operation 104 exfoliates a layer of silicon from the silicon substrate along the defect layer to form a composite substrate of GaN/silicon or silicon carbide. The thicknesses of the two layers in the composite substrate of GaN/silicon is selected according to the above description, for example, the silicon thickness is less than 30×, preferably less than 15×, or more preferably less than 5×, of the GaN layer thickness.

Figure 9:
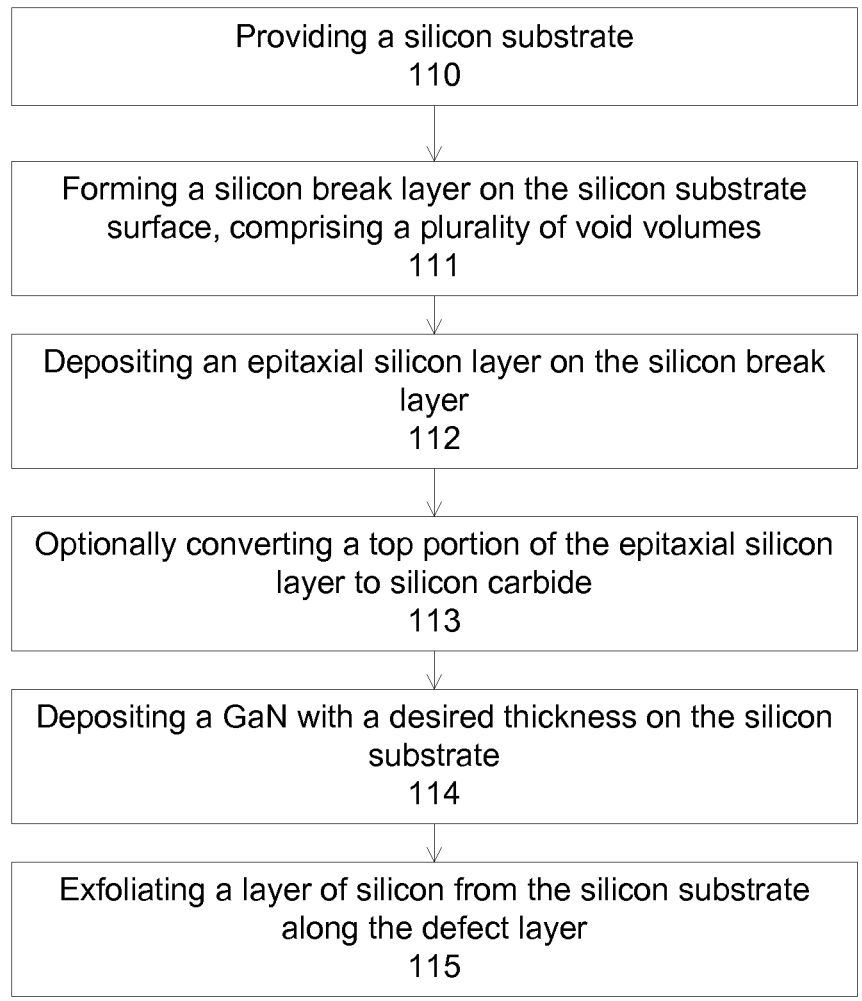
FIG. 9 illustrates another exemplary flowchart to form a composite substrate comprising a GaN layer on a silicon or silicon carbide layer according to an embodiment of the present invention.

FIG. 9 illustrates another exemplary flowchart to form a composite substrate comprising a GaN layer on a silicon or silicon carbide layer according to an embodiment of the present invention. Operation 110 provides a silicon substrate. Operation 111 forms a silicon break layer on the silicon substrate surface, comprising a plurality of void volumes, such as a porous silicon layer or a patterned silicon layer. Operation 112 deposits an epitaxial silicon layer on the silicon break layer. Operation 113 optionally converts a top portion of the silicon substrate to silicon carbide. Operation 114 deposits a GaN with a desired thickness on the silicon substrate. Operation 115 exfoliates a layer of silicon from the silicon substrate along the defect layer to form a composite substrate of GaN/silicon or silicon carbide. The thicknesses of the two layers in the composite substrate of GaN/silicon is selected according to the above description, for example, the silicon thickness is less than 30×, preferably less than 15×, or more preferably less than 5×, of the GaN layer thickness.

In an embodiment, the present invention discloses a process forming a thin silicon layer on a support substrate. The support substrate can improve the transportability of the silicon layer, for example, by providing rigidity and adding thickness to the silicon layer. The support substrate can ease the thickness restriction of the GaN/silicon ratio, for example, by having a high thermal expansion coefficient so that any thickness of GaN would be acceptable. For example, the substrate can ease the thermal expansion mismatched between the GaN layer and the silicon layer, for example, by having a thermal expansion larger than silicon, and preferably similar or larger than GaN.

In an embodiment, a silicon layer is coupled to a substrate, for example, to support the silicon layer. The substrate can be attached to the silicon layer after the silicon layer is prepared. Alternatively, the substrate can be attached to the silicon substrate to prepare the silicon layer. The substrate can serve as a support layer coupled to the silicon layer, for example, to facilitate the transport of the thin silicon layer.

In an embodiment, the present invention discloses applying a ceramic paste with high thermal expansion coefficient (e.g., higher than that of silicon substrate) on a silicon substrate. After a high temperature anneal, the ceramic paste is solidified and bonded with the silicon surface. The composite substrate comprising a silicon layer on a ceramic layer can have an effective thermal expansion coefficient similar to that of GaN, thus can accommodate the subsequent deposition of GaN without any cracking. The silicon substrate surface can be any crystallographic plane, such as (100) or (110), and preferably (111).

Figure 10A:
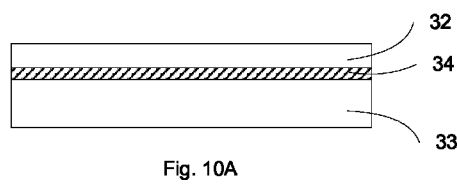
FIGS. 10A-10C illustrate an exemplary substrate having a silicon layer and a process for preparing such as substrate according to an embodiment of the present invention.
Figure 10B:
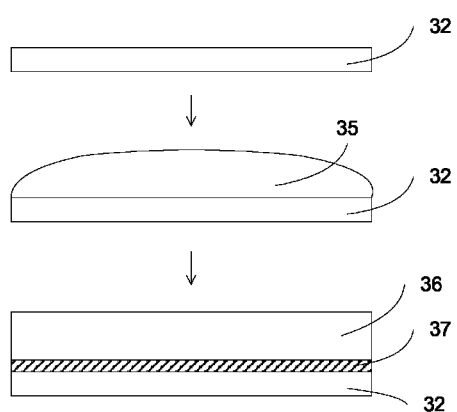
Figure 10C:
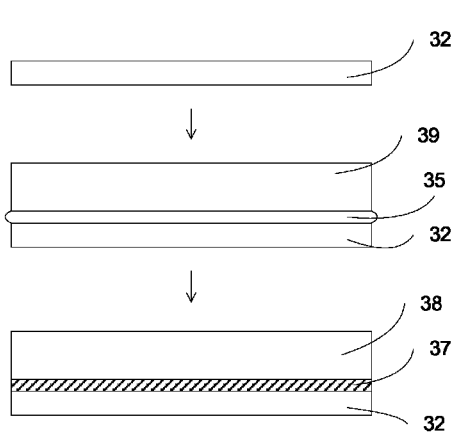

FIGS. 10A-10C illustrate an exemplary substrate having a silicon layer and a process for preparing such as substrate according to an embodiment of the present invention. In FIG. 10A, a support layer 33 is coupled to a silicon layer 32 through an interface layer 34. The support layer can be adequately thick to allow transportation of the silicon wafer, for example, by robot transferring from a storage carrier to a process chamber. The support layer can have thermal expansion coefficient equal or greater than that of silicon, thus can offer thicker silicon layer (or thinner GaN layer). For example, if the thermal expansion coefficient of the support layer is similar to that of GaN, the requirement for the thickness of the GaN layer can be calculated using the total thickness of GaN and the support layer. The support layer preferably has a thermal expansion coefficient similar or greater than that of GaN. An interface layer 34 is disposed between the support layer 33 and the silicon layer, providing bonding adhesion between the two layers, especially during GaN and subsequent high temperature processing. A support layer having thermal expansion coefficient equal to that of silicon can be used to provide support and insulation for a thin silicon substrate.

FIG. 10B shows an exemplary process sequence to prepare such a substrate according to an embodiment of the present invention. A silicon layer 32 is prepared, and a ceramic paste 35 is applied on a surface of the silicon layer 32. The ceramic paste can be selected so that the thermal expansion coefficient is similar or greater than that of GaN. In some embodiments, the thermal expansion coefficient is smaller than that of GaN. For example, a thermal expansion coefficient value between that of GaN and that of silicon can provide a composite substrate having thermal expansion coefficient greater than that of silicon, and can allow the growth of GaN without cracking. In some embodiments, the thermal expansion coefficient is similar to or less than that of silicon.

After a high temperature anneal (for example, at about 600-1200 C), the ceramic paste is sintered, forming a ceramic layer 36 bonded to the silicon layer 32 through an interface layer 37. During the high temperature anneal, the ceramic reacts with the silicon, forming a strong bond that can sustain subsequent high temperature processing. The ratio of the thicknesses of the ceramic and the silicon is preferably as described about to enable GaN deposition without cracking.

FIG. 10C shows another exemplary process sequence to prepare such a substrate according to an embodiment of the present invention. A silicon layer 32 is prepared, and a ceramic paste 35 is applied on a surface of the silicon layer 32. A top ceramic layer 39 is disposed on the ceramic paste 35. In an embodiment, the ceramic layer is a solid and rigid layer, for example, serving to flattening the thin silicon layer. The ceramic layer can comprise the same or different compositions as the ceramic paste, and preferably has similar composition so that the ceramic paste and the ceramic layer are easily bonded after sintering. Optional claims can be added to flattening the silicon layer. After a high temperature anneal, the ceramic paste is sintered, forming a ceramic layer 38 bonded to the silicon layer 32 through an interface layer 37. The ceramic layer 38 can be a composite layer, comprising the sintered paste and the top ceramic layer. The ceramic layer 38 can be a single ceramic layer, with the ceramic paste fused with the top ceramic layer. The ratio of the thicknesses of the ceramic and the silicon is preferably as described about to enable GaN deposition without cracking.

Figure 11A:
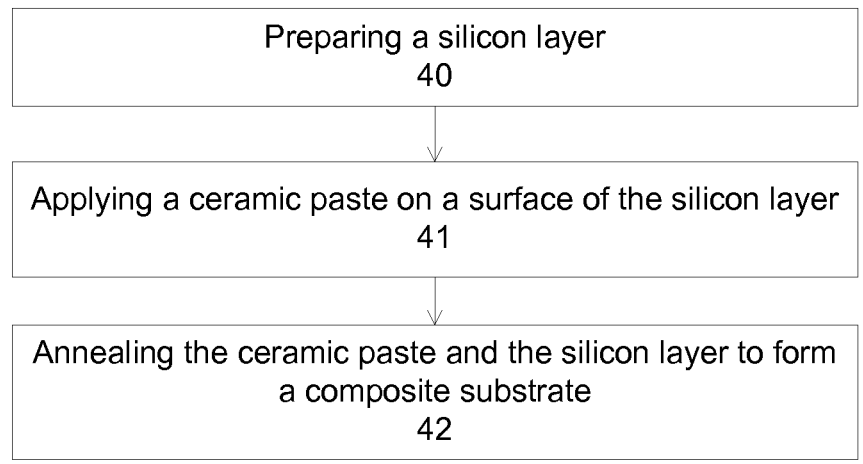
FIGS. 11A-11B illustrate exemplary methods to prepare a composite substrate according to an embodiment of the present invention.
Figure 11B:
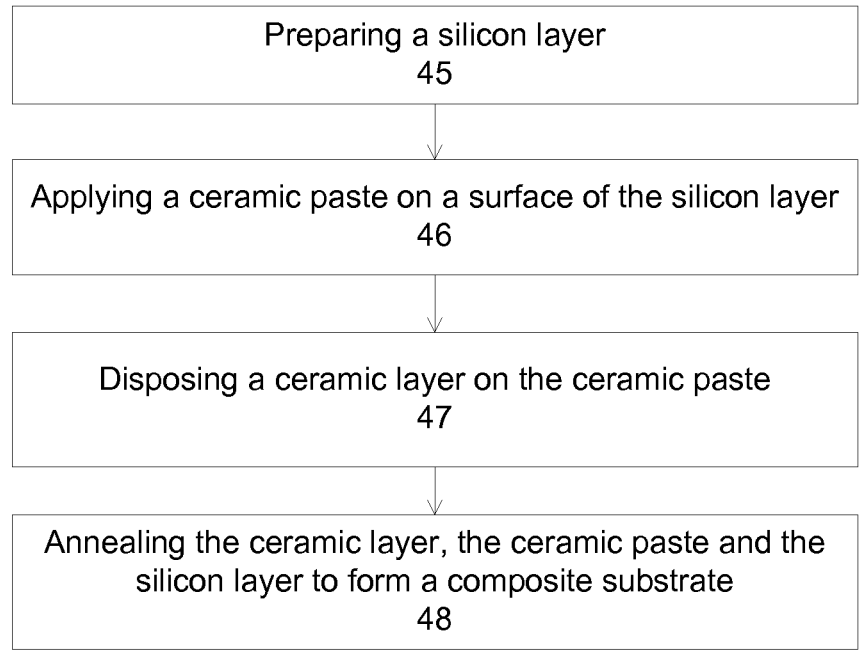

FIGS. 11A-11B illustrate exemplary methods to prepare a composite substrate according to an embodiment of the present invention. The composite substrate comprises a ceramic layer disposed on a silicon layer, wherein the ceramic layer is formed from a high temperature anneal of a ceramic paste. The ratio of the thicknesses of the ceramic and the silicon is preferably as described about to enable GaN deposition without cracking.

In FIG. 11A, operation 40 prepares a silicon layer. Operation 41 applies a ceramic paste on a surface of the silicon layer. Operation 42 anneals the ceramic paste and the silicon layer to form a composite substrate. In FIG. 11B, operation 45 prepares a silicon layer. Operation 46 applies a ceramic paste on a surface of the silicon layer. Operation 47 disposes a ceramic layer on the ceramic paste. Operation 48 anneals the ceramic layer, the ceramic paste and the silicon layer to form a composite substrate.

In an embodiment, the present invention discloses a substrate, and method to fabricate such a substrate, comprising a ceramic layer, a silicon layer (e.g., silicon-containing layer), and a GaN layer. The composite substrate comprising a silicon layer on a ceramic layer as described above can be used to deposit GaN without cracking, for example, since the thermal expansion coefficient of the composite substrate is designed to be similar to that of GaN, or greater than that of silicon.

In an embodiment, the present invention discloses applying a ceramic paste with high thermal expansion coefficient (e.g., higher than that of silicon substrate) on a silicon substrate that has a defect plane generated underneath the surface. After a high temperature anneal, the ceramic paste is solidified and bonded with the silicon surface. When cooled to room temperature, the difference in thermal expansion can cause the silicon substrate to exfoliate at the defect plane, creating a composite substrate comprising a silicon layer strongly bonded with a ceramic support layer. The silicon substrate surface can be any crystallographic plane, such as (100) or (110), and preferably (111).

Figure 12A:
FIGS. 12A-12E illustrate an exemplary process to form a GaN layer on a silicon substrate using an exfoliate process according to an embodiment of the present invention.
Figure 12B:
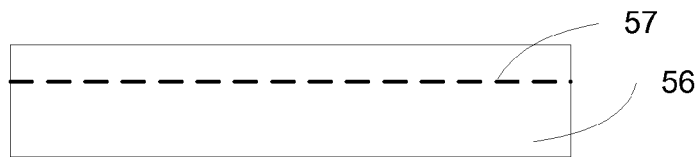
Figure 12C:
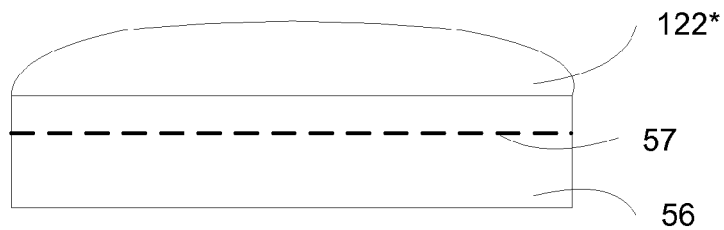
Figure 12D:
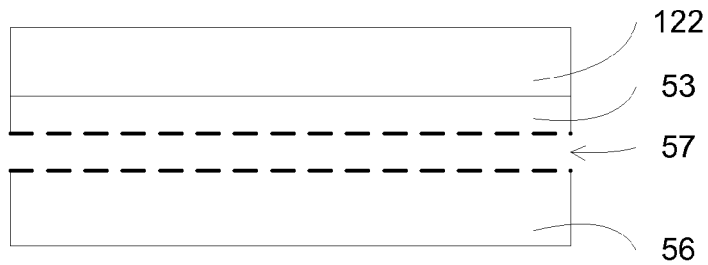
Figure 12E:
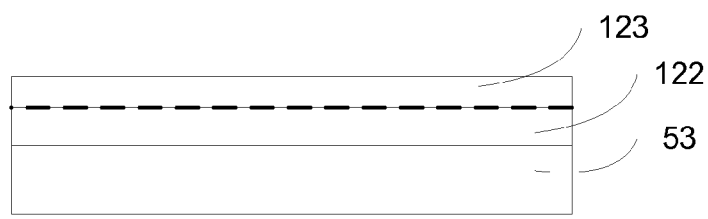

FIGS. 12A-12E illustrate an exemplary process to form a GaN layer on a silicon substrate using an exfoliate process according to an embodiment of the present invention. In FIG. 12A, a silicon substrate 56, preferably having (111) orientation surface, is provided. An impurity implantation process, such as hydrogen, helium or oxygen implantation, is performed on the surface of the silicon wafer 56, creating an impurity region 57 underneath the silicon surface (FIG. 12B). The silicon substrate 56 with the implantation layer 57 is then subjected to a ceramic paste process, coating a layer of ceramic paste 122* on the silicon surface (FIG. 12C). The substrate is annealed at high temperature, sintering the ceramic. Upon cooling to room temperature, the thermal expansion mismatch can exfoliate the silicon substrate at the defect plane of impurity implantation 57, creating a composite substrate comprising a ceramic layer 122 on a silicon layer, and a remaining silicon substrate (FIG. 12D). In an embodiment, a rapid cooling process can be used, for example, to accelerate the exfoliation process. In an embodiment, a GaN deposition process deposits a layer of GaN 123 on the silicon surface (FIG. 12E). In an embodiment, the silicon substrate 56 can be subjected to a conversion process to convert a top layer to silicon carbide, effectively creating a silicon carbide on ceramic layer.

Figure 13A:
FIGS. 13A-13F illustrate an exemplary process to form a GaN layer on a silicon layer using an exfoliate process on a porous silicon substrate according to an embodiment of the present invention.
Figure 13B:
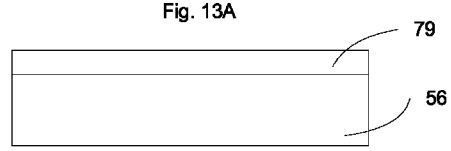
Figure 13C:
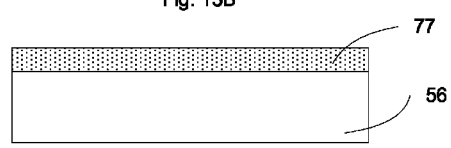
Figure 13D:
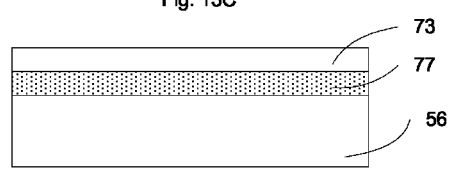
Figure 13E:
Figure 13F:
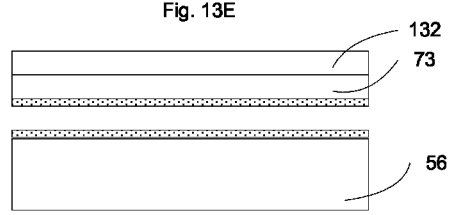

FIGS. 13A-13F illustrate an exemplary process to form a GaN layer on a silicon layer using an exfoliate process on a porous silicon substrate according to an embodiment of the present invention. In FIG. 13A, a silicon substrate 56, preferably having (111) orientation surface, is provided. A thin epitaxial silicon layer 77 is deposited on the silicon substrate 56, preferably having impurities to facilitate a subsequent wet etch process (FIG. 13B). An etch process, such as a wet etch process, and preferably an anodic etch process, is performed on the deposited silicon layer 79. Defects are preferentially etched, creating a porous silicon layer 77 (FIG. 13C). Small pores at the surface are preferred, to facilitate a subsequent epitaxial silicon deposition, with the remaining silicon on the surface serving as seed sites. Larger pores underneath the surface are preferred, to facilitate a subsequent exfoliation process. Multiple silicon layers 79 can be deposited with different defect densities, to create multiple layers having different pore densities. In FIG. 13D, a second epitaxial silicon layer 73 is deposited on the porous silicon layer 77. The silicon substrate is then subjected to a ceramic paste process, coating a layer of ceramic paste 132* on the silicon surface (FIG. 13E). The substrate is annealed at high temperature, sintering the ceramic. Upon cooling to room temperature, the thermal expansion mismatch can exfoliate the silicon substrate at the defect plane of impurity implantation 57, creating a composite substrate comprising a ceramic layer 132 on a silicon layer, and a remaining silicon substrate (FIG. 13F). In an embodiment, a rapid cooling process can be used, for example, to accelerate the exfoliation process. In an embodiment, a GaN deposition process deposits a layer of GaN on the silicon surface. In an embodiment, the silicon substrate 56 can be subjected to a conversion process to convert a top layer to silicon carbide, effectively creating a silicon carbide on ceramic layer. Other process to create a porous silicon layer can be used, such as a patterned silicon layer using lithography mask.

Figure 14:
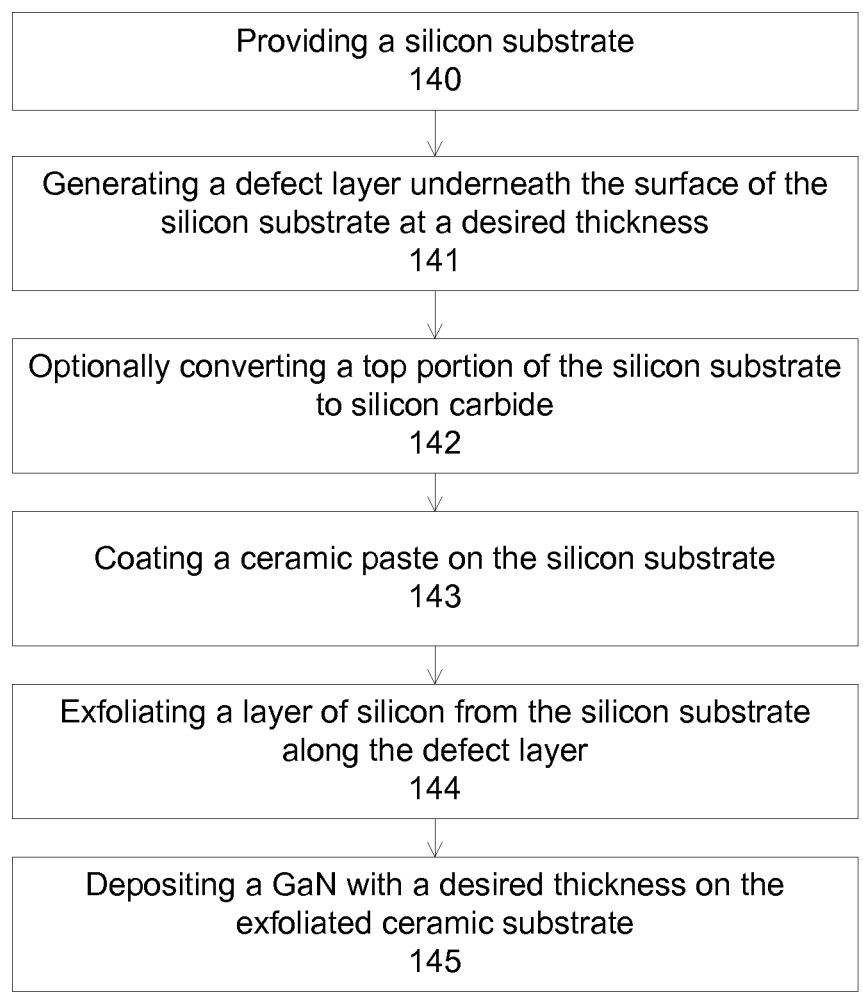
FIGS. 14 and 15 illustrate exemplary process flows for forming substrates having a silicon layer on a ceramic support.
Figure 15:
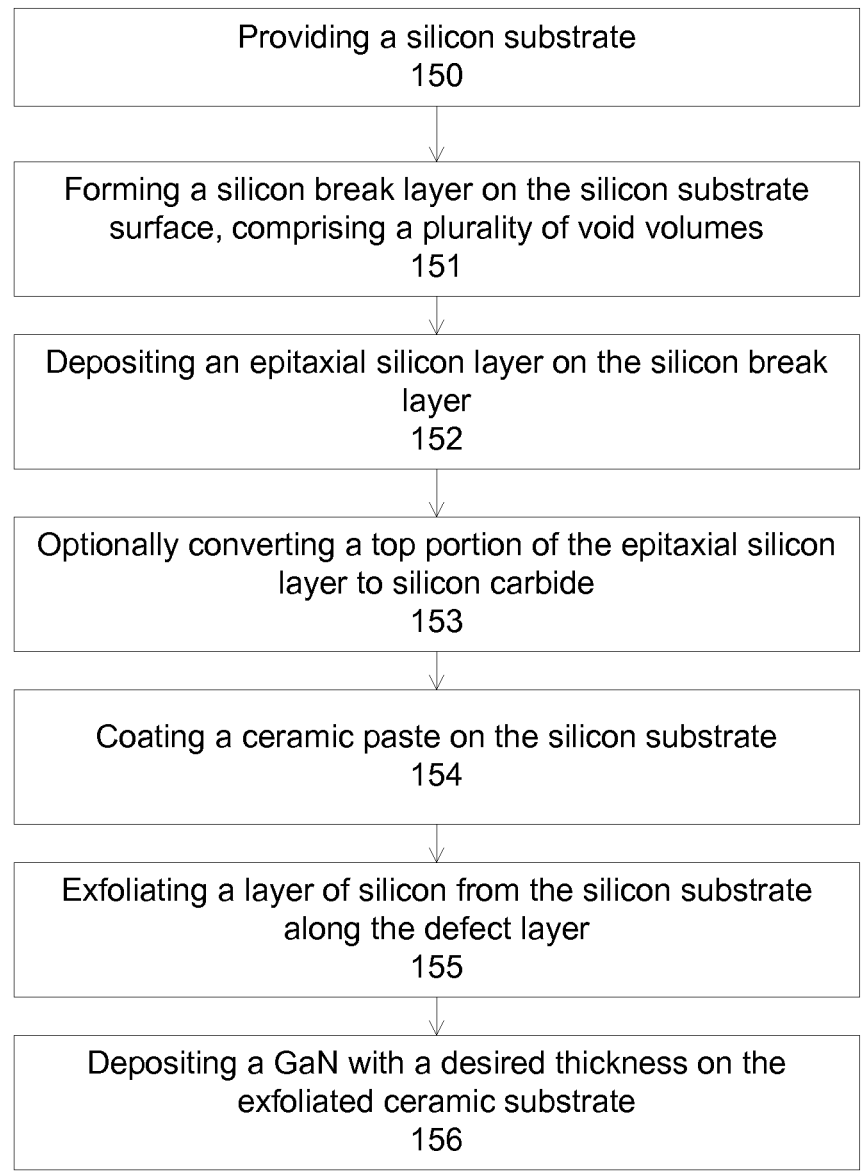

FIGS. 14 and 15 illustrate exemplary process flows for forming substrates having a silicon layer on a ceramic support. In FIG. 14, operation 140 provides a silicon substrate. Operation 141 generates a defect layer underneath the surface of the silicon substrate at a desired thickness. Operation 142 optionally converts a top portion of the silicon substrate to silicon carbide. Operation 143 coats a ceramic paste on the silicon substrate. Operation 144 exfoliates a layer of silicon from the silicon substrate along the defect layer. Operation 145 deposits a GaN with a desired thickness on the exfoliated ceramic substrate.

In FIG. 15, operation 150 provides a silicon substrate. Operation 151 forms a silicon break layer on the silicon substrate surface, comprising a plurality of void volumes. Operation 152 deposits an epitaxial silicon layer on the silicon break layer. Operation 153 optionally converts a top portion of the epitaxial silicon layer to silicon carbide. Operation 154 coats a ceramic paste on the silicon substrate. Operation 155 exfoliates a layer of silicon from the silicon substrate along the defect layer. Operation 156 deposits a GaN with a desired thickness on the exfoliated ceramic substrate.

In some embodiments, after the ion implantation process, a low temperature anneal, e.g., between 200 and 500 C, can be performed to enlarge the cavities defined by the implanted species. Forces can be provided on the implant surface to permit lateral growth of the implant species and avoid bump formation.

In some embodiments, the present invention discloses a thin silicon wafer supported on a mother wafer. For example, a parting or cleavage layer can be first defined at a desired depth in a 'mother silicon wafer' by ion implantation. Here, the type and energy of the bombarding ions, their depth of entry into the wafer, and thereby determines the approximate thickness of the thin wafer that will result, if cleaved. Hydrogen, helium, and oxygen, and carbon, are the usually used to implant for cleaving purpose. The 'ion implanted' thin wafer is left on the mother wafer, to which it is tenuously attached, is as used as the gallium nitride growth substrate. After gallium nitride growth by MOCVD or other methods, after deposition of 'buffer layers' of AlN, AlGaN, or others known in the art, for bridging the lattice mismatch between silicon and gallium nitride at elevated temperatures, the substrate is cooled to room temperature. During the heating to the growth temperature, the cavities created by implanted gases coalesce by the so-called OSWALD Ripening mechanism, into larger voids below the wafer surface. That very thin silicon layer exerts much less stress on the gallium nitride, compared to thickness of wafer conventionally used. The gallium nitride layer deposited on the wafer surface becomes the 'handle layer' for the thin silicon. Upon cooling the CTE mismatch stress between the two materials, rather than cause cracking of the gallium nitride layer, gets relieved by spontaneous 'exfoliation' of the thin silicon layer, together with gallium nitride, from the thicker mother wafer.

In a variation of the above, the thin silicon layer is defined in a thicker wafer by ion implantation, with mono-energetic ions, in conventional ion-implanters, with energies in the range of 100 to 1000 key, this gives rise to silicon thicknesses in the range of <1 micron to 10 microns. Ion implanters used in the semiconductor impurity doping application can be used for delineation of the wafer thickness to be cleaved can be about 10 microns or less. In this case, it would not be possible to cleave and handle the wafer as a free standing wafer.

In another variation of the above method to make wafers, in the thickness range of 10 microns or thicker, specialized high energy ion implanters penetrating that deep into silicon, very specialized, high energy implanters are needed.

The two factors, (i) that the silicon wafer on which the gallium nitride is deposited is very thin compared to thickness of wafer conventionally used, exerts less stress-load on the gallium nitride, and (ii) the flexibility of detached wafer with its gallium nitride layer, also aids in stress dissipation, both contribute to obtaining, thick crack-free gallium nitride layer, not hitherto possible when conventionally thick silicon wafers.

In another method for growing crack-free gallium nitride on a silicon wafer involves, forming a 'parting layer' of porous silicon structure at the silicon wafer surface by anodization in HF, depositing single crystal silicon of desired thickness, and subsequently growing for gallium nitride by MOCVD, cooling the substrate to room temperature to separate the epitaxial silicon along with gallium nitride from the mother wafer.

In some embodiments, the present invention discloses a thin silicon layer supported on a ceramic handling layer. The ceramic layer can have CTE greater than that of gallium nitride, and by forming the handle, in-situ on the wafer, simply from power precursors. After the thin wafer is delineated in a thicker wafer by either methods described above, i.e. ion-implantation or by porous silicon—epi silicon methods, the thin wafer is first exfoliated from the mother wafer, by forming a handling layer, in-situ, on the thin wafer surface, the handling layer ceramic having CTE equal to or greater than that of gallium nitride, using the silicon side of the resulting wafer-ceramic composite gallium nitride growth. Here, the ceramic coating reinforces and separates the thin silicon layer at the level of the separation layer formed by ion implantation or porous silicon layer, and subsequently modifies the CTE. The CTE of the composite wafer will equal or exceed that of gallium nitride, thereby ensuring that the latter when grown and cooled, will not crack. Examples of such ceramics are certain crystallizing glasses in the MgO—$Al_2O_3$—$SiO_2$, $Li_2OAl_2O_3SiO_2$, and BaO—$Al_2O_3$—$SiO_2$ systems. These glasses, in the powder form, are deposited on the silicon surface, and sintered at temperatures around 1000 C, when they form dense ceramic structures that adhere well to the silicon surface.

In some embodiments, the present invention discloses ceramic paste and ceramic tape for used in the fabrication of the ceramic layer. A robust solution to the cracking problem of gallium nitride on silicon can come from altering the stress-state of the gallium nitride from tensile to compressive, by altering CTE behavior of the silicon substrate. In some embodiments of this invention, this can be accomplished by first forming a composite structure consisting of a silicon wafer with a refractory material whose CTE is higher than that of gallium nitride. Such a composite structure, hereinafter, referred to simply as silicon-composite wafer, can be tailored to have a CTE equal to or higher than that of gallium nitride. A gallium nitride film grown at elevated temperatures on the silicon side of the silicon-composite wafer, and subsequently cooled to ambient temperature will not crack because the film will be in compression, have no stress at all, or have tensile stress that does not damage the composite structure.

The refractory component of the silicon-composite wafer can be a ceramic, glass, glass-ceramic, or ceramic-metal (CERMET), capable of enduring long dwells at high temperatures involved in epitaxial growth of GaN on silicon, without melting, decomposing, changing its structure, separating from the silicon wafer, or sticking to the susceptor. It should also not contaminate the wafers, or the deposition chamber, in any way. Additionally, the refractory layer should endure all the wafer cleaning steps at the front end, and during epitaxial growth, the harsh gaseous precursors and hydrogen reduction step at elevated temperatures. The refractory material should be inexpensive and readily available The refractory layer can be formed in-situ from powder pre-cursors right on the wafer surface. Glass powders of certain crystallizing glass compositions, are deposited on the oxidized surface of the silicon wafer, and re-flowed at high temperatures, to soften, and wet, sinter and crystallize, and adhere to the oxidized silicon wafer surface. Upon crystallizing, the properties of the glass usually change, often drastically. In general, the crystallized glass becomes more refractory, strong, and more resistant to etching or dissolution in chemicals such as hydrofluoric acid and phosphoric acid than the starting glass. The crystallized glass-ceramic layer has to withstand the harsh wafer cleaning chemicals prior to placing it in the GaN reactor. It should be capable of enduring the high temperatures of gallium nitride deposition. The CTE of the crystallized glass will depend on the nature and amounts of the crystalline phases formed. The glass system chosen for this application should yield strong, refractory, chemically resistant coatings having CTEs higher than that of gallium nitride. CTE of GaN is give in the literature as $5.93 \times 10^{-6}$/C. Preferable range of CTEs of the glass-ceramic coatings ranges from $(6-9)\times10^{-6}$ and more preferably in the range of $(5-7)\times10^{-6}$/C over temperature range from 25-1000 C.

In some embodiments, certain special glass compositions whose powders sinter well between 800 C-1000 C, while simultaneously becoming crystalline, are useful in-situ fabrication of the support substrate of this invention. These compositions were originally developed for fabricating multi-layer ceramic substrates with thick film inks of copper, silver, or gold. In some preferred embodiments, a $MgO$—$Al_2O_3$—$SiO_2$ glass composition, having MgO in the range of 15-28% by weight, $Al_2O_3$ in the range of 9-15% by weight, the remainder being silica, except for less than 2% of nucleating agents such as $TiO_2$, $ZrO_2$, $P_2O_5$, or $B_2O_3$. The glass powder of this composition fully densified and crystallizes in the temperature range of 850 C to 950 C, thereby co-sintering with thick film silver or copper pastes. The expansion coefficient of the crystallized glasses closely matched to that of silicon, and can be increased over a certain range by increasing the proportion of MgO.

In some embodiments, compositions consisting of physical mixtures of ceramic powders, usually alumina, with significant volume fraction of glasses that soften and flow at temperatures well below 1000° C. can also used for fabricating such structures, but in these mixtures the glass component is typically low melting glass, which will compromise the required stability at temperatures typical of epitaxial deposition of gallium nitride.

In some embodiments, this invention discloses another approach of forming silicon composite wafers for use as substrates for gallium nitride deposition, consisting of attaching a separately sintered ceramic substrate to the silicon wafer. The types of ceramic suitable for this application are similar to those listed above for in-situ sinter ceramic layer above viz. high strength, ability to withstand the gallium nitride growth temperatures, chemical inertness towards common reagents used to prepare silicon wafers, and non-reacting with the pre-cursor gases and hydrogen at the deposition temperature. Along with these attributes, the most important attribute of the ceramic is its CTE over the range from ambient temperature to the gallium nitride growth temperature, can be from that of silicon to that of GaN or higher. In some embodiment, the CTE can be higher than that of GaN, with values in the range of CTE of $(7-10)\times10^{-6}$/C, or can be in the range $(6-8)\times10^{-6}$/C.

Sintered ceramic substrates fitting the above requirements are many. Examples are alumina, all grades of commercially-available grades of alumina, yttria, zirconia, mullite ($3Al_2O_3$-$2SiO_2$), and other common refractory ceramics. In some embodiments, common ceramics such as sintered silicon carbide, aluminum nitride and silicon nitride can have too small a CTE to be useful for this application. Certain sintered glass-ceramics in the lithium alumino-silicate, and magnesium alumino-silicate, are also suitable, if the CTE is the range of $(5-7)\times10^{-6}$/C.

In some embodiments, for the composite wafer approach to be effective, refractory substrate should be as thick as practical, and the silicon wafer should be as thin as possible. And the two should adhere well to each other. Under these conditions, the CTE of the resulting composite should be sufficiently increased from the value of silicon alone, can equal or exceed the CTE of gallium nitride from the ambient temperature to the growth temperature. Typically, the thickness of ceramic substrate should be similar to thicknesses of commonly used silicon wafers. These range from 100-1000 microns, and the preferred range is 200-500 microns. The silicon wafer thickness of the composite wafer should be in the range of thinnest wafers that can be easily obtained, i.e. 200 microns, to 25 microns. Preferred range is from 150 microns to 50 microns. The thinnest of the wafers can be obtained by wafer thinning by polishing or by chemical thinning in a suitable reagent.

In some embodiments, methods for forming such ceramic substrates include the following:

1. Thermal bonding of the ceramic to oxide layer of the silicon
2. Field-assisted-bonding between the oxide layer on the silicon and the ceramic
3. Bonding with a thin, layer of glass deposited at the interface.

In some embodiments, methods 1 and 2 require native oxide layers on both surfaces and intimate (atomically smooth) contact across the entire bonding interface. In addition, Method 2 requires both a load and a voltage to be applied to effect bonding. Therefore it is preferred to smoothen the surfaces before bonding ceramic substrates, in cases where the ceramic substrates having high roughness of several microns.

In some embodiments, method 3 is the preferred method for large wafers because the wafer surface and the ceramic surface need not be in contact across the entire interface. Here the glass bonding layer is chosen to soften, flow and wet to both the oxide layer on the silicon and to most oxide ceramics at the bonding temperature. The glass layer can also fill the interface gaps of reasonable size well to produce a strong bond.

If the glass bonding layer of 3 remains in the vitreous state, it will likely be too fluid at temperatures of 1000 C, typical for gallium nitride epitaxy. By choosing a glass that crystallizes to a refractory crystalline glass-ceramic upon bonding to the two surfaces, this problem can be overcome. Such glasses generally soften at temperature of 700-1000 C and crystallize to yield a predominantly ceramic structure, which is generally stronger, more refractory than its glass precursor. The resulting glass-ceramic should have CTEs in the range of values between that of silicon and the sintered ceramic being bonded.

In some embodiments, glass compositions meting these requirements can be found in $MgO$—$Al_2O_3$—$SiO_2$ and $Li_2OAl_2O_3SiO_2$ systems, the fabrication described earlier. An example of a glass composition suitable for this application is a ternary glass having the compositors given in the ranges of weight percent as: $MgO$—26, $Al_2O_3$—23, $SiO_2$—51. Glasses in this composition field can be tailored to have CTEs in their crystallized state to lie between $(3.5-7)\times10^{-6}$/C. Other examples of such crystallizing glass seals can be used.

In some embodiments, the silicon (111)-ceramic composite are prepared separately from the gallium nitride deposition. The GaN deposition is carried out by Molecular Beam Epitaxy, MBE, or by Metal Organic Chemical Vapor Deposition, MOCVD. The first stages of gallium nitride deposition, buffer layers of AlN and AlGaN are deposited, as in prior art methods, to bridge the lattice mismatch between Si (111) and gallium nitride. Gallium nitride deposition is continued on after buffer layer deposition. The gallium nitride layer will remain crack-free upon cooling.

In an embodiment, the present invention discloses large silicon substrates and methods for fabricating such substrates, to sustain a GaN layer without cracking Generally speaking, the larger the area of the GaN layer, the higher probability that the GaN will crack, for example, due to the high number of defect sites. Thus, in an embodiment, the present invention discloses separating the GaN layer into smaller areas, thus reducing the probability of cracking. For example, the GaN is disposed on islands of silicon, thus the stress is greater at the islands, and less at the void volumes between the islands. Alternatively a composite layer of GaN/silicon (or GaN/silicon carbide) is disposed on islands of a silicon substrate.

Figure 16A:
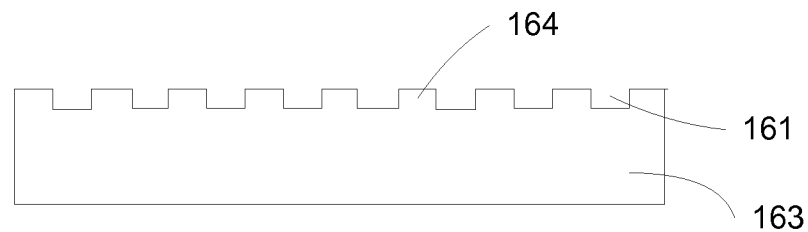
FIGS. 16A-16B illustrate exemplary substrates for islanding GaN according to an embodiment of the present invention.
Figure 16B:
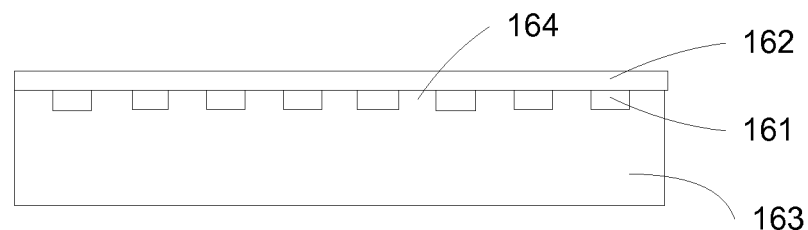

FIGS. 16A-16B illustrate exemplary substrates for islanding GaN according to an embodiment of the present invention. FIG. 16A shows a silicon substrate 163 (or silicon-containing substrate, such as silicon carbide substrate), comprising islands 164 together with void volumes 161. The ratio of voids and islands are designed to achieve GaN without cracking. FIG. 16B shows a silicon substrate 163, comprising islands 164 together with void volumes 161. A layer of GaN 162 is disposed on the islands 164 without cracking.

Figure 17A:
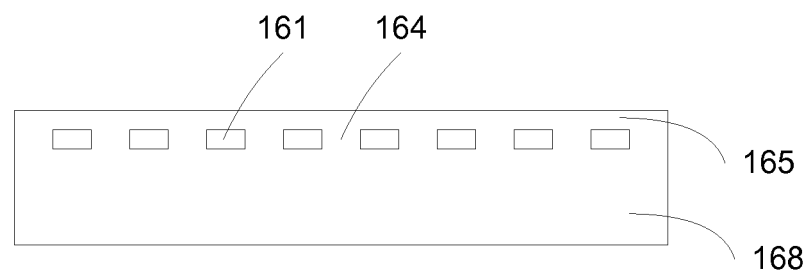
FIGS. 17A-17B illustrate other exemplary substrates for islanding GaN according to an embodiment of the present invention.
Figure 17B:
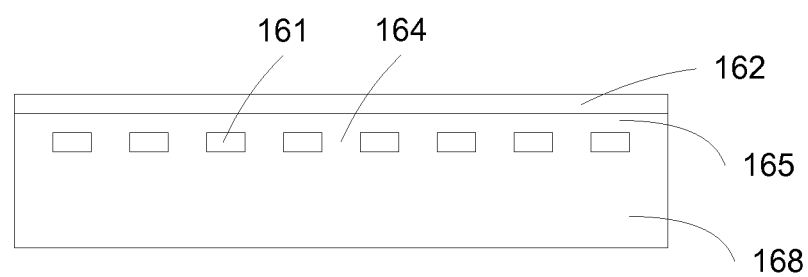

FIGS. 17A-17B illustrate other exemplary substrates for islanding GaN according to an embodiment of the present invention. FIG. 17A shows a silicon substrate 168 (or silicon-containing substrate, such as silicon carbide substrate), comprising islands 164 together with void volumes 161. The ratio of voids and islands are designed to achieve GaN without cracking. A layer of epitaxial silicon is disposed on the islands 164. FIG. 17B shows a silicon substrate 168, comprising islands 164 together with void volumes 161. A layer of GaN 162 is disposed on the islands 164 without cracking.

Figure 18A:
FIGS. 18A-18D illustrate an exemplary process to form a GaN layer on an islanded silicon substrate according to an embodiment of the present invention.
Figure 18B:
Figure 18C:
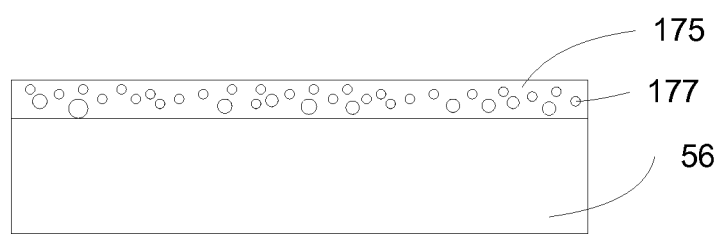
Figure 18D:
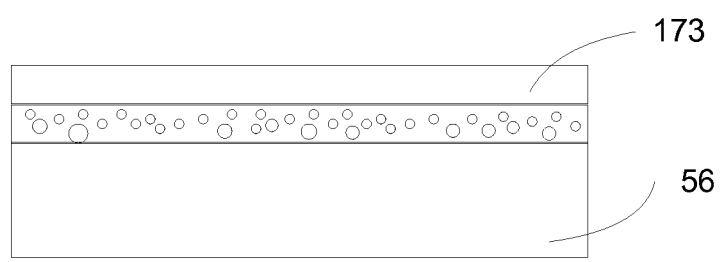

FIGS. 18A-18D illustrate an exemplary process to form a GaN layer on an islanded silicon substrate according to an embodiment of the present invention. In FIG. 18A, a silicon substrate 56, preferably having (111) orientation surface, is provided. A thin epitaxial silicon layer 79 is deposited on the silicon substrate 56, preferably having impurities to facilitate a subsequent wet etch process (FIG. 18B). An etch process, such as a wet etch process, and preferably an anodic etch process, is performed on the deposited silicon layer 79. Defects are preferentially etched, creating a porous silicon layer 177 having void 175 (FIG. 18C). Small pores at the surface are preferred, to facilitate a subsequent epitaxial silicon deposition, with the remaining silicon on the surface serving as seed sites. Larger pores underneath the surface are preferred, to facilitate a subsequent exfoliation process. Multiple silicon layers 79 can be deposited with different defect densities, to create multiple layers having different pore densities. The substrate is now ready for GaN deposition. In FIG. 18D, the silicon substrate is then subjected to a GaN deposition process, depositing a layer of GaN 173 on the silicon surface.

Figure 19A:
FIGS. 19A-19C illustrate another exemplary process to form a GaN layer on an islanded silicon substrate according to an embodiment of the present invention.
Figure 19B:
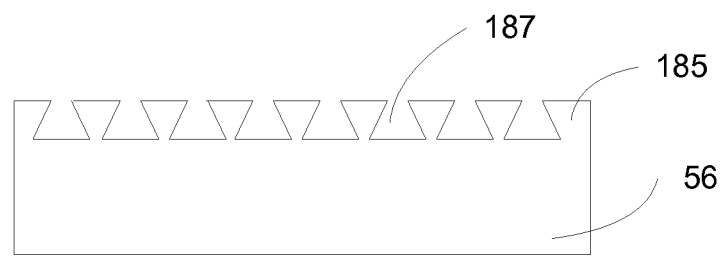
Figure 19C:
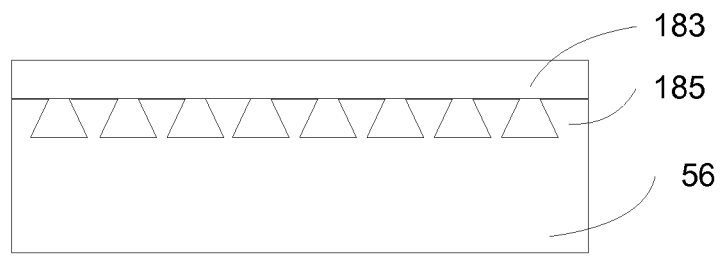

Other processes to form an islanded silicon layer can be used, such as an impurity implantation and wet etch to remove impurities, or a patterning process. FIGS. 19A-19C illustrate another exemplary process to form a GaN layer on an islanded silicon substrate according to an embodiment of the present invention. In FIG. 19A, a silicon substrate 56, preferably having (111) orientation surface, is provided. A patterning process, such as a wet etch process utilizing a lithography mask, is performed on the surface of the silicon substrate 56. The etch pattern can be tapers, larger at the bottom and smaller at the top near the silicon surface, creating an islanded silicon layer 185 having voids 187 (FIG. 19B). Small openings at the surface are preferred, to facilitate a subsequent epitaxial silicon deposition, with the remaining silicon on the surface serving as seed sites. Larger openings underneath the surface are preferred, to facilitate a subsequent exfoliation process. In FIG. 19C, a GaN layer 183 is deposited on the islanded silicon layer 185. The GaN is more stressed at locations of silicon islands 185, and is less stress at locations of voids 187. This can reduce the tendency to crack.

Figure 20A:
FIGS. 20A-20E illustrate an exemplary process to form a GaN layer on an islanded silicon substrate using a silicon layer according to an embodiment of the present invention.
Figure 20B:
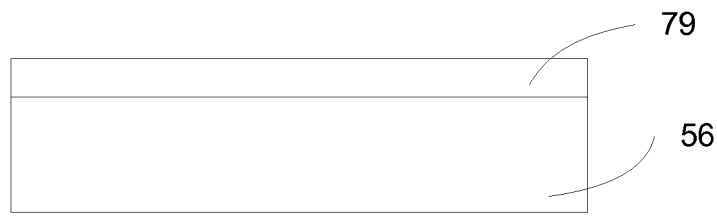
Figure 20C:
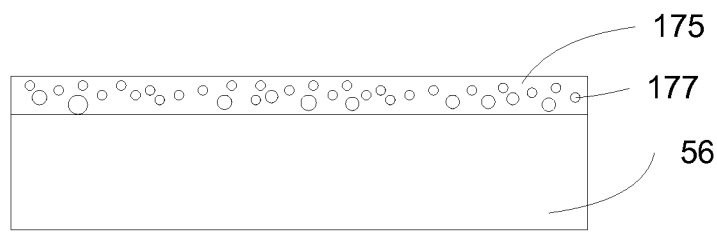
Figure 20D:
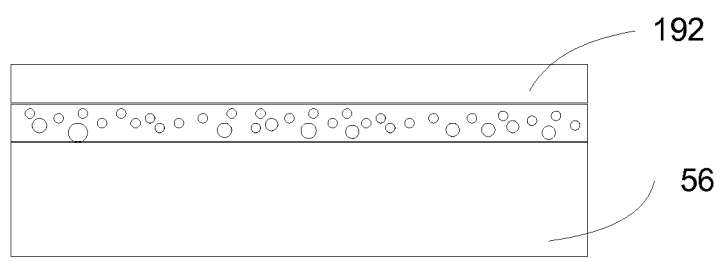
Figure 20E:
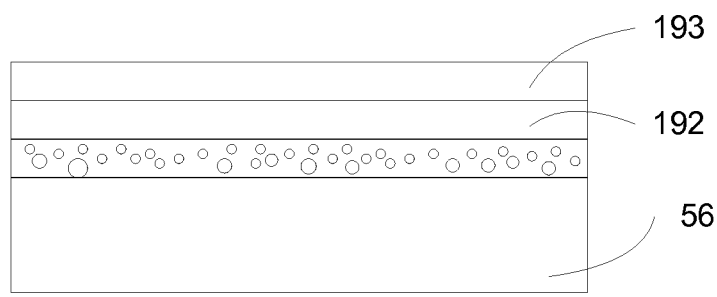

FIGS. 20A-20E illustrate an exemplary process to form a GaN layer on an islanded silicon substrate using a silicon layer according to an embodiment of the present invention. In FIG. 20A, a silicon substrate 56, preferably having (111) orientation surface, is provided. A thin epitaxial silicon layer 79 is deposited on the silicon substrate 56, preferably having impurities to facilitate a subsequent wet etch process (FIG. 20B). An etch process, such as a wet etch process, and preferably an anodic etch process, is performed on the deposited silicon layer 79. Defects are preferentially etched, creating an islanded silicon layer 175 having voids 177 (FIG. 20C). Small pores at the surface are preferred, to facilitate a subsequent epitaxial silicon deposition, with the remaining silicon on the surface serving as seed sites. Larger pores underneath the surface are preferred, to facilitate a subsequent exfoliation process. Multiple silicon layers 79 can be deposited with different defect densities, to create multiple layers having different pore densities. In FIG. 20D, a second epitaxial silicon layer 192 is deposited on the islanded silicon layer 175. The silicon substrate is then subjected to a GaN deposition process, depositing a layer of GaN 173 on the silicon surface (FIG. 20E).

Figure 21A:
FIGS. 21A-21D illustrate another exemplary process to form a GaN layer on an islanded silicon substrate according to an embodiment of the present invention.
Figure 21B:
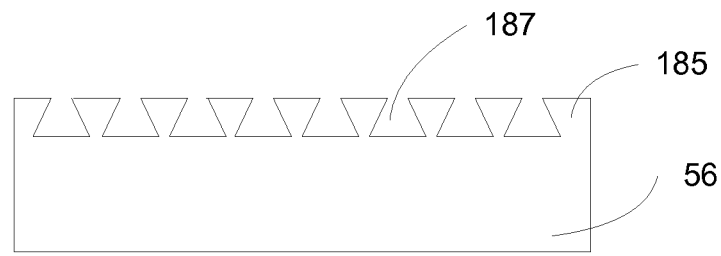
Figure 21C:
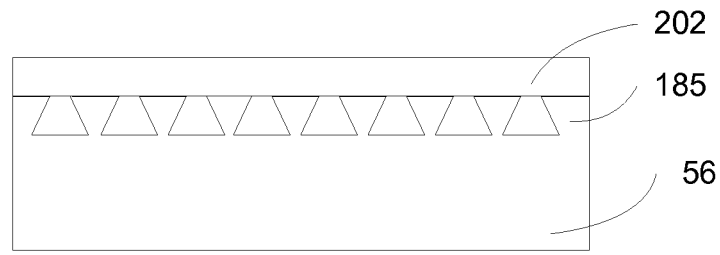
Figure 21D:
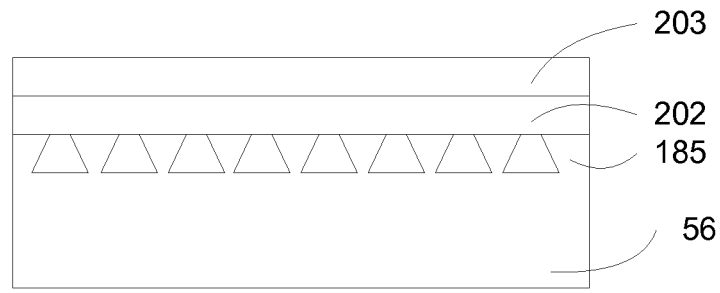

FIGS. 21A-21D illustrate another exemplary process to form a GaN layer on an islanded silicon substrate according to an embodiment of the present invention. In FIG. 21A, a silicon substrate 56, preferably having (111) orientation surface, is provided. A patterning process, such as a wet etch process utilizing a lithography mask, is performed on the surface of the silicon substrate 56. The etch pattern can be tapers, larger at the bottom and smaller at the top near the silicon surface, creating an islanded silicon layer 185 having voids 187 (FIG. 21B). Small openings at the surface are preferred, to facilitate a subsequent epitaxial silicon deposition, with the remaining silicon on the surface serving as seed sites. Larger openings underneath the surface are preferred, to facilitate a subsequent exfoliation process. In FIG. 21C, a second epitaxial silicon layer 202 is deposited on the islanded silicon layer 185 with voids 187. The silicon substrate is then subjected to a GaN deposition process, depositing a layer of GaN 203 on the silicon surface (FIG. 21D).

Figure 22:
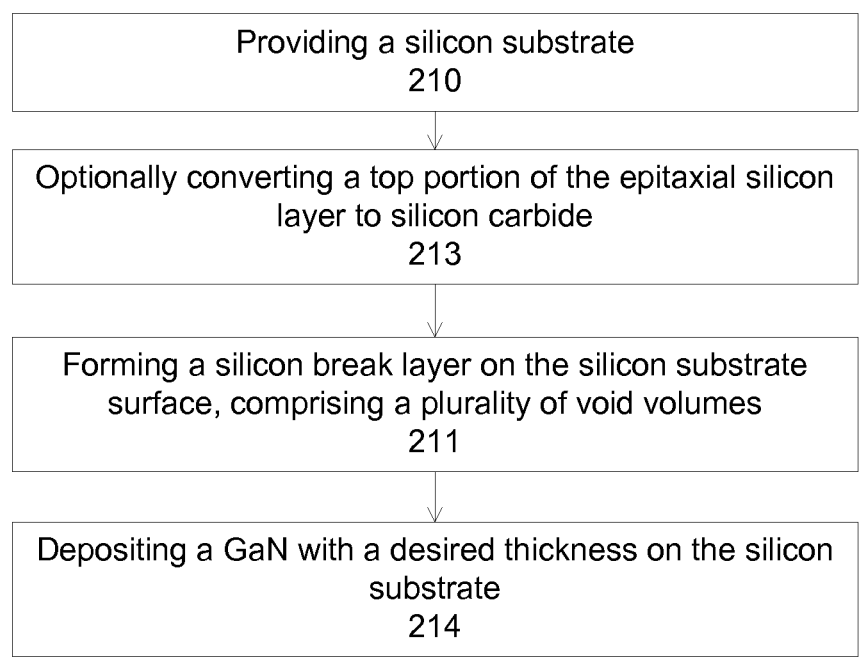
FIGS. 22 and 23 illustrate exemplary process flows for forming substrates having an islanded silicon substrate.
Figure 23:
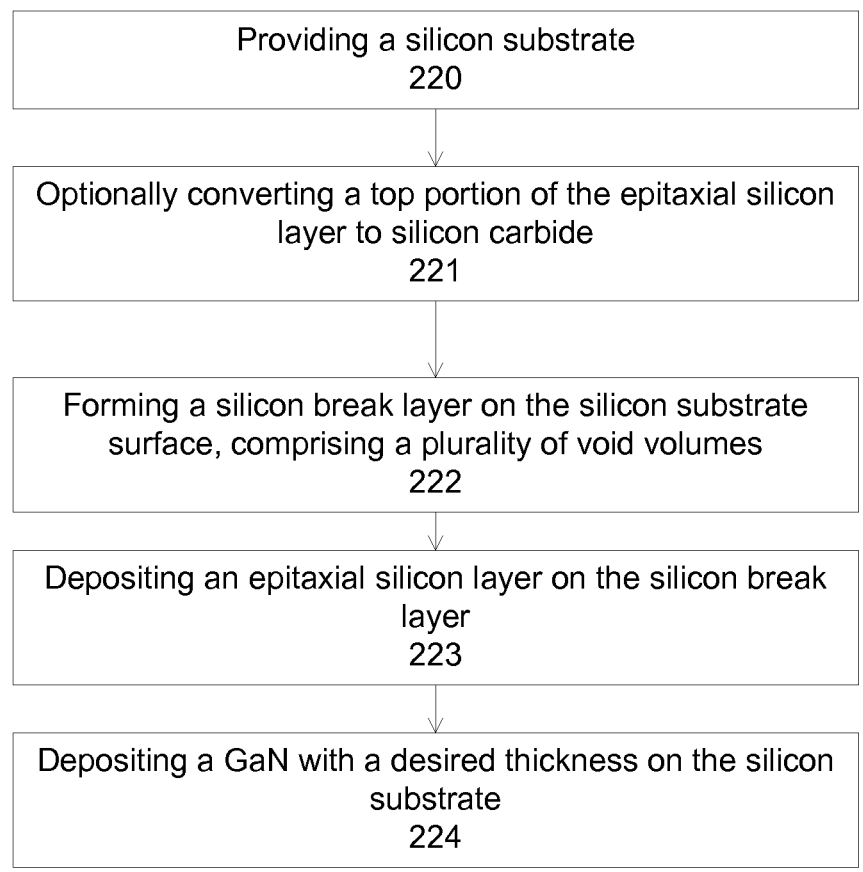

FIGS. 22 and 23 illustrate exemplary process flows for forming substrates having an islanded silicon substrate. In FIG. 22, operation 210 provides a silicon substrate. Operation 213 optionally converts a top portion of the epitaxial silicon layer to silicon carbide. Operation 211 forms a silicon break layer on the silicon substrate surface, comprising a plurality of void volumes. Operation 214 deposits a GaN with a desired thickness on the silicon substrate.

In FIG. 23, operation 220 provides a silicon substrate. Operation 221 optionally converts a top portion of the epitaxial silicon layer to silicon carbide. Operation 222 forms a silicon break layer on the silicon substrate surface, comprising a plurality of void volumes. Operation 223 deposits an epitaxial silicon layer on the silicon break layer. Operation 224 deposits a GaN with a desired thickness on the silicon substrate.

In some embodiments, the present invention discloses a composite substrate, and method of forming the composite substrate, including a ceramic layer sandwiched between two layers of silicon. The two silicon layers can produce silicon-ceramic composite wafers having little or no curvature, even with a high CTE mismatch between silicon and ceramic. For example, the CTE of the ceramic can be higher than that of silicon, from room temperature to 1000-1200 C. The two silicon layers can minimize exposing ceramic surfaces, since the backside of the ceramic layer is covered by the second silicon layer.

The double-silicon composite substrate can be used for growing gallium nitride and related LED structures of thicknesses 2 um or greater, that will remain crack-free when cooled to room temperature after film growth. The double-silicon composite substrate can be used to be processed in both sides, for example for growing GaN on both exposed (111) silicon surfaces. Sequential or simultaneous growth of GaN on the double-silicon composite substrate can be performed.

In some embodiments, the present invention discloses a composite substrate, which includes a ceramic layer disposed between two layers of single crystal silicon. The composite substrate can be symmetric, e.g., the thicknesses of the two silicon layers are essentially similar, thus the composite substrate remains substantially flat, without or with minimal curvature.

In some embodiments, the same or similar ceramic as described above, having a CTE equal or greater than that of silicon or, in some embodiments, larger than that of gallium nitride, is used to bond together two thin silicon wafers, of nearly equal thickness, to form a balanced structure. Such a composite layer with high CTE value can still have the benefit of having higher effective CTE than silicon alone, and in fact a CTE approaching or exceeding that of gallium nitride, while remaining essentially flat at all temperatures. It can also have the further advantages of protecting the ceramic from reacting with the reactor gasses at high temperatures.

In some embodiments, both sides of the composite substrate can be used for gallium nitride growth, one after the other with intermediate cooling to turn them over. Alternatively, the reactors can be configured to grow gallium nitride on both sides of the composite simultaneously, significantly increasing MOCVD productivity.

Figure 24A:
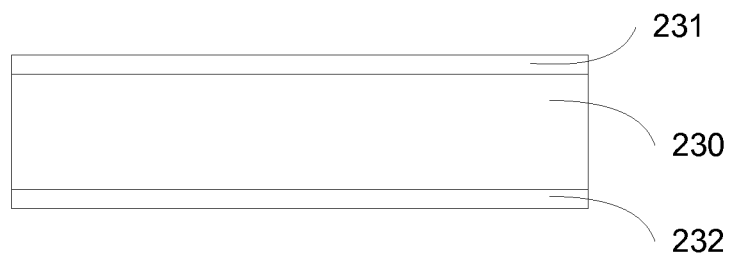
FIGS. 24A-24C illustrate composite substrates having double sided silicon layers according to some embodiments of the present invention.
Figure 24B:
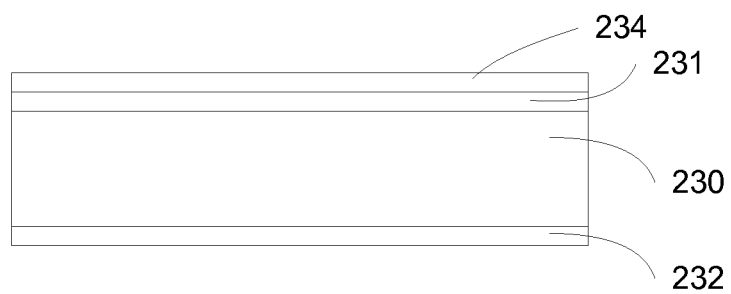
Figure 24C:
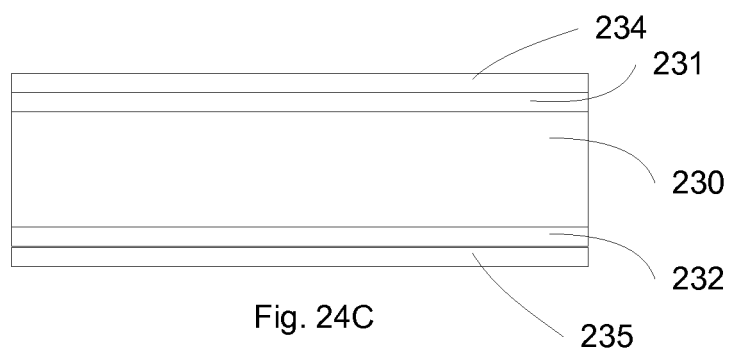

FIGS. 24A-24C illustrate composite substrates having double sided silicon layers according to some embodiments of the present invention. In FIG. 24A, a ceramic layer 230 is sandwiched between a top silicon layer 231 and a bottom silicon layer 232. The composition of the ceramic can be similar to that described above, for example, having CTE similar to silicon for strengthening thin silicon substrate, or having higher CTE (e.g., lower, equal or higher than that of GaN) for growing crack-free GaN. The thicknesses of the layers can be similar to those described above, for example, a much thicker ceramic layer than the silicon layer. In some embodiments, the composite substrate can have similar thickness as the conventional silicon substrate, e.g., about 700 microns for 6" substrate. In some embodiments, the silicon thickness can be less than 50 microns, or less than 20 microns, or less than 5 microns.

In some embodiments, the present invention discloses methods to form composite substrates having double sided silicon layers. Two silicon layers can sandwich a ceramic paste, and the composite substrate is annealed at high temperature, e.g., between 800 to 1200 C, to sinter the ceramic. Alternatively, two silicon layers can sandwich a ceramic tape, and the composite substrate is annealed at high temperature, e.g., between 800 to 1200 C, to sinter the ceramic. Bonding layers, such as a silicon oxide layer, can be provided between the silicon and the ceramic surfaces to improve the bonding strength.

In some embodiments, exfoliation process, e.g., by ion implantation or by porous silicon, can be used to form the composite substrate. The two silicon layers can be bonded sequentially or simultaneously to the ceramic. For example, a ceramic paste can be provided between two thick silicon substrates having ion implanted defect planes. Upon annealing, the silicon exfoliates, forming a composite substrate having the ceramic layer between two layers of thin silicon.

The composite substrate can be used to growth other film, such as GaN. FIG. 24B shows a composite substrate having another layer 234, such as a GaN layer, deposited on one of the silicon layer 231. FIG. 24C shows a composite substrate having two layers 234 and 235, such as GaN layers, deposited on both silicon layers 231 and 232.

What is claimed is:

1. A method to form a composite substrate, the method comprising
   providing a first substrate, wherein the first substrate comprises silicon;
   providing a second substrate, wherein the second substrate comprises silicon;
   ion implanting a species to a first surface of the first substrate;
   ion implanting a species to a second surface of the second substrate;
   annealing the ion implanted substrates at a first temperature;
   applying a layer of ceramic on the first surface, wherein the ceramic comprises a thermal expansion coefficient greater than that of silicon;
   positioning the second surface on an opposite side of the ceramic layer;
   annealing the ceramic layer at a second temperature, wherein a layer is exfoliated from each substrate and bonded to the ceramic layer.

2. A method as in claim 1 further comprising
   oxidizing the substrates before annealing at the first temperature.

3. A method as in claim 1 wherein the species is implanted to a depth of equal or less than 5 microns.

4. A method as in claim 1 wherein the first anneal is performed at temperature between 200 and 500 C.

5. A method as in claim 1 wherein the thermal expansion coefficient is between that of silicon and that of GaN.

6. A method to form a composite substrate, the method comprising
   providing a first substrate, wherein the first substrate comprises silicon;
   providing a second substrate, wherein the second substrate comprises silicon;
   ion implanting a species to a first surface of the first substrate;
   ion implanting a species to a second surface of the second substrate;
   applying a layer of ceramic on the first surface, wherein the ceramic comprises a thermal expansion coefficient greater than that of silicon;
   positioning the second surface on an opposite side of the ceramic layer;
   annealing the ceramic layer, wherein a layer is exfoliated from each substrate and bonded to the ceramic layer.

7. A method as in claim 6 further comprising
   oxidizing the substrates before annealing at the first temperature.

8. A method as in claim 6 wherein the species is implanted to a depth of equal or less than 5 microns.

9. A method as in claim 6 wherein the anneal is performed at temperature between 800 and 1200 C.

10. A method as in claim 6 wherein the thermal expansion coefficient is between that of silicon and that of GaN.

* * * * *